United States Patent [19]

Yokoya et al.

[11] Patent Number: 5,554,482

[45] Date of Patent: Sep. 10, 1996

[54] SILVER HALIDE LIGHT-SENSITIVE MATERIAL CONTAINING BASE PRECURSOR AND POLYVINYL ALCOHOL

[75] Inventors: Hiroaki Yokoya; Akihiro Endo, both of Shizuoka, Japan

[73] Assignee: Fuji Photo Film Co., Ltd., Kanagawa, Japan

[21] Appl. No.: 428,892

[22] Filed: Apr. 25, 1995

[30] Foreign Application Priority Data

| Apr. 25, 1994 | [JP] | Japan | 6-109031 |
| May 18, 1994 | [JP] | Japan | 6-128194 |
| Jun. 10, 1994 | [JP] | Japan | 6-152813 |

[51] Int. Cl.$^6$ .............. G03C 8/08; G03C 8/40; G03C 1/498; G03F 7/06
[52] U.S. Cl. ............... 430/203; 430/215; 430/264; 430/271.1; 430/281.1; 430/617; 430/627; 430/638; 430/955
[58] Field of Search .................. 430/215, 536, 430/330, 270, 271, 281, 523, 203, 264, 627, 617, 638, 955

[56] References Cited

U.S. PATENT DOCUMENTS

| 4,818,662 | 4/1989 | Aono et al. | 430/215 |
| 5,122,443 | 6/1992 | Takeda | 430/330 |
| 5,290,659 | 3/1994 | Takeda | 430/203 |
| 5,304,454 | 4/1994 | Yokoya et al. | 430/255 |
| 5,326,667 | 7/1994 | Yokoya et al. | 430/203 |
| 5,328,800 | 7/1994 | Yokoya et al. | 430/203 |

OTHER PUBLICATIONS

Encyolopedia of Polymer Science and Engineering, vol. 17, pp. 167–198, John Wiley & Sons, Inc., 1989.

Primary Examiner—Richard L. Schilling
Attorney, Agent, or Firm—Birch, Stewart, Kolasch & Birch, LLP

[57] ABSTRACT

A silver halide light-sensitive material is disclosed. The light-sensitive material comprises a support and two or more layers. Silver halide, a reducing agent, an ethylenically unsaturated polymerizable compound or a cross-linkable polymer and a base precursor are independently contained in at least one of the layers. A layer containing the base precursor further contains a specific polyvinyl alcohol. The first embodiment of the specific polyvinyl alcohol (I) has such a chemical structure that a terminal alkyl group having 4 or more carbon atoms is attached to a polyvinyl alcohol. The second embodiment of the specific polyvinyl alcohol (II) is a block copolymer consisting of a vinyl alcohol unit and a hydrophobic unit, which is more hydrophobic than the vinyl alcohol unit. The third embodiment is a mixture of two polyvinyl alcohols (III) and (IV). The polyvinyl alcohol (III) has a saponification degree of not less than 95%. The polyvinyl alcohol (IV) has a saponification degree of less than 95% and a block character of not more than 0.5.

21 Claims, 1 Drawing Sheet

SILVER HALIDE LIGHT-SENSITIVE MATERIAL CONTAINING BASE PRECURSOR AND POLYVINYL ALCOHOL

FIELD OF THE INVENTION

The present invention relates to a silver halide light-sensitive material comprising a support and two or more layers. Silver halide, a reducing agent, an ethylenically unsaturated polymerizable compound or a cross-linkable polymer and a base precursor are independently contained in at least one of the layers. The silver halide functions as a photosensor. A polymer image is formed by hardening the polymerizable compound or the cross-linkable polymer.

BACKGROUND OF THE INVENTION

U.S. Pat. No. 4,629,676 (Hayakawa et al) and European Patent Publication No. 0174634B1 disclose an image forming method comprising the steps of imagewise exposing to light a light-sensitive material, and heating the light-sensitive material. The light-sensitive material comprises a support and a light-sensitive hardening layer containing silver halide, a reducing agent and a polymerizable compound. The light-sensitive material is heated to develop the silver halide and to harden the polymerizable compound. The light-sensitive material usually contains a base precursor as a development accelerator.

U.S. Pat. Nos. 5,122,443 (Takeda), 5,290,659 (Takeda) and 5,393,651 (Hoshi) disclose embodiments of the above-mentioned light-sensitive material, which are advantageously used for the preparation of a lithographic plate. U.S. Pat. Nos. 5,304,454 (Yokoya et al), 5,326,667 (Yokoya et al) and 5,328,800 (Yokoya et al) disclose other embodiments of the light-sensitive material, which is advantageously used for the preparation of a color proof. In the light-sensitive materials for the lithographic plate or the color proof, a cross-linkable polymer can be used in place of or in addition to the polymerizable compound. Further, the light-sensitive hardening layer comprises a hardening layer containing the polymerizable compound or the cross-linkable polymer and a light-sensitive layer containing silver halide. An overcoating layer containing a base precursor may be provided on the light-sensitive layer.

As is described in U.S. Pat. No. 5,122,443 (at column 20, lines 1 to 43), a polyvinyl alcohol having a high saponification degree (preferably not less than 70%, more preferably not less than 80%, and most preferably not less than 95%) is preferably used as a hydrophilic binder contained in the light-sensitive layer or the overcoating layer. Such a polyvinyl alcohol has a function of preventing influence of oxygen in the air (which has a function of inhibiting a polymerization reaction). A polymerization reaction at heat development can smoothly proceed by the function of the polyvinyl alcohol of a high saponification degree. This effect is remarkable when the saponification degree is not less than 95%.

In addition to the polyvinyl alcohol, a surface active agent can be added to the light-sensitive layer or the overcoating layer. U.S. Pat. No. 5,122,443 describes that an ethylene oxide nonionic surface active agent can be contained in the light-sensitive layer or the overcoating layer. The ethylene oxide nonionic surface active agent can be advantageously used in a light-sensitive material containing silver halide, a reducing agent and a polymerizable compound. U.S. Pat. No. 4,956,260 (Nakamura) discloses the ethylene oxide nonionic surface active agent in more detail.

SUMMARY OF THE INVENTION

The applicants have studied the polyvinyl alcohol and the surface active agent used in a layer containing a base precursor.

As is described in U.S. Pat. No. 5,122,443, a polyvinyl alcohol of a high saponification degree is advantageously used at a heat development process. However, the applicants note a problem of such a polyvinyl alcohol at a stage of forming a layer containing a base precursor. In the formation of the layer, particles of the base precursor tend to be agglomerated in the coating solution of the layer. Further, the stability of the coating solution is insufficient. The coated layer is remarkably turbid. Therefore, the layer containing the base precursor scatters light to reduce the resolving power of the light-sensitive material. Further, the agglomerated base precursor particles cannot uniformly accelerate the heat development.

An object of the present invention is to provide a silver halide light-sensitive material which has a layer uniformly containing a base precursor formed by a stable coating solution.

The present invention provides a silver halide light-sensitive material which comprises a support and two or more layers, and silver halide, a reducing agent, an ethylenically unsaturated polymerizable compound or a cross-linkable polymer and a base precursor being independently contained in at least one of the layers, wherein a layer containing the base precursor further contains a modified polyvinyl alcohol (I) having such a chemical structure that a terminal alkyl group having 4 or more carbon atoms is attached to a polyvinyl alcohol.

The invention also provides a silver halide light-sensitive material which comprises a support and two or more layers, and silver halide, a reducing agent, an ethylenically unsaturated polymerizable compound or a cross-linkable polymer and a base precursor being independently contained in at least one of the layers, wherein a layer containing the base precursor further contains a modified polyvinyl alcohol (II) which is a block copolymer consisting of vinyl alcohol units and hydrophobic units which are more hydrophobic than the vinyl alcohol units.

The invention further provides a silver halide light-sensitive material which comprises a support and two or more layers, and silver halide, a reducing agent, an ethylenically unsaturated polymerizable compound or a cross-linkable polymer and a base precursor being independently contained in at least one of the layers, wherein a layer containing the base precursor further contains a mixture of polyvinyl alcohols (III) and (IV), said polyvinyl alcohol (III) having a saponification degree of not less than 95%, and said polyvinyl alcohol (IV) having a saponification degree of less than 95% and a block character of not more than 0.5.

The present invention is characterized in that a specific polyvinyl alcohol is used in a layer containing a base precursor. The specific polyvinyl alcohol is the above-defined (I), (II) or the mixture of (III) and (IV).

The specific polyvinyl alcohol inhibits the agglomeration of the particles of the base precursor contained in the coating solution. Therefore, the stability of the coating solution is remarkably improved. Further, the formed layer is scarcely turbid.

As a result, the light-sensitive layer of the present invention can form a uniform image at the heat development. Further, the layer containing the base precursor does not reduce the resolving power of the light-sensitive material.

DETAILED DESCRIPTION OF THE INVENTION

Polyvinyl alcohol (I)

Figure 1:
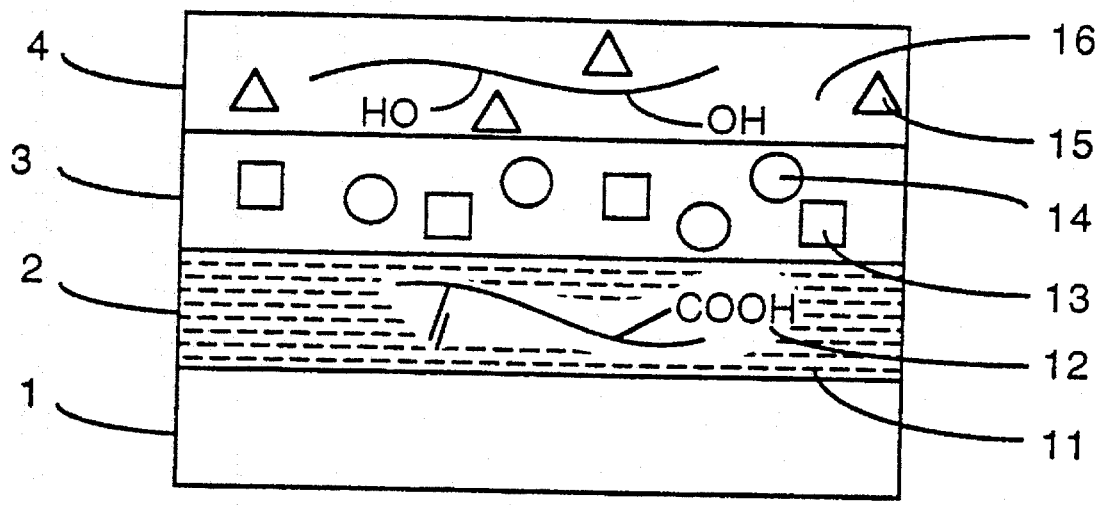
FIG. 1 is a sectional view schematically illustrating an embodiment of a silver halide light-sensitive material of the present invention.

The first embodiment of the present invention uses a modified polyvinyl alcohol (I) having such a chemical structure that a terminal alkyl group having 4 or more carbon atoms is attached to a polyvinyl alcohol. The polyvinyl alcohol (I) is obtained by introducing the alkyl group into the polymerization end of a polyvinyl alcohol. The polyvinyl alcohol may be partially saponified.

The terminal alkyl group may have a straight, branched or cyclic structure. A straight or branched structure is preferred. The alkyl group preferably has 8 or more carbon atoms. The upper limit of the number of the carbon atom usually is 30 (preferably is 25).

The polyvinyl alcohol (I) preferably has a saponification degree of not less than 60%, more preferably not less than 70%, and most preferably not less than 80%. The polymerization degree of the polyvinyl alcohol (I) is preferably not less than 100, more preferably not less than 200, and most preferably not less than 300. The upper limit of the polymerization degree is usually about 3,000.

The polyvinyl alcohol (I) may be copolymerized with another monomer. Examples of the other monomers include maleic acid, itaconic acid, crotonic acid, fumaric acid, esters or anhydrides thereof, acrylamide, methacrylamide, allylsulfonic acid and vinylsulfonic acid.

A preferred polyvinyl alcohol (I) is represented by the formula (Ia).

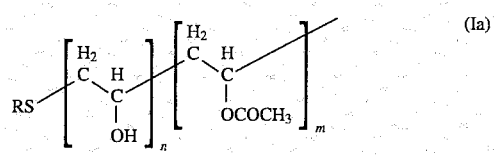

wherein R is an alkyl group having 4 or more carbon atoms, n is the mol % of the vinyl alcohol units, and m is the mol % of the vinyl acetate units. The saponification degree means n/(n+m).

Examples of the polyvinyl alcohol (I) are shown below.

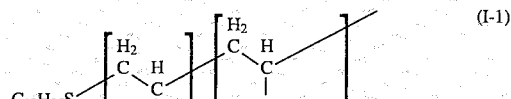

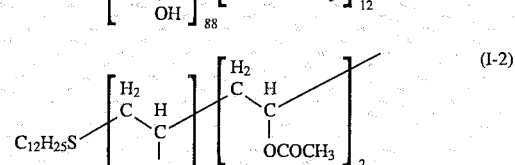

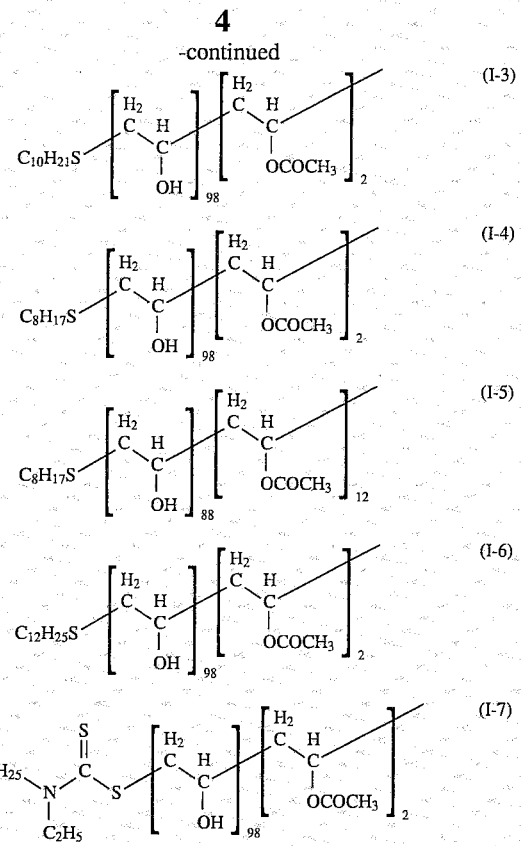

The end of the polyvinyl alcohol can be modified according to a known process to obtain the polyvinyl alcohol (I). For example, a modification process is described in Synthesis and Reaction of Polymer (1), (written in Japanese, Kyoritsu Shuppan, Polymer Society, pages 144 to 150). In more detail, an alkyl group can be introduced into the end of a polyvinyl alcohol by a polymerization process (1) using a polymerization initiator forming a terminal alkyl group or a polymerization process (2) using a chain transfer agent forming a terminal alkyl group such as an alkylthiol.

The polyvinyl alcohol (I) can be synthesized by polymerizing vinyl acetate according to the process (1) or (2) to obtain polyvinyl acetate having a terminal alkyl group and saponifying the polyvinyl acetate. Maruyama et al., Br. Polym. J.P., volume 20, page 345 (1988) reports a synthesis of the polyvinyl alcohol represented by the formula (Ia) according to the above-mentioned process.

The polyvinyl alcohol (I) is commercially available. Examples of the commercial products include MP-103 and MP 203 (Kuraray Co., Ltd.).

The amount of the polyvinyl alcohol (I) is preferably in the range of 0.1 to 20%, more preferably in the range of 0.5 to 10%, and most preferably in the range of 1 to 5% based on the solid content of the layer containing the base precursor.

Two or more polyvinyl alcohols (I) can be used in combination.

Ethylene oxide nonionic surface active agent

In the first embodiment, the polyvinyl alcohol (I) is preferably used in combination with an ethylene oxide nonionic surface active agent. The surface active agent preferably contains 10 or more ethylene oxide units in its molecule. A surface active agent usually has a distribution of the number of the ethylene oxide unit ($-CH_2CH_2O-$). Accordingly, the average number of the ethylene oxide unit is preferably 10 or more.

The nonionic surface active agent has neither positive nor negative charge in its structure. In other words, the ethylene oxide nonionic surface active agent does not have a group that is dissociated in water. Many documents classify known surface active agents. For example, Hiroshi Horiguchi, New Surface Active Agent (written in Japanese, Sankyo Shuppan, pages 9 to 18) describes the classifications.

Preferred ethylene oxide nonionic surface active agents are represented by the formulas (S-a) to (S-k).

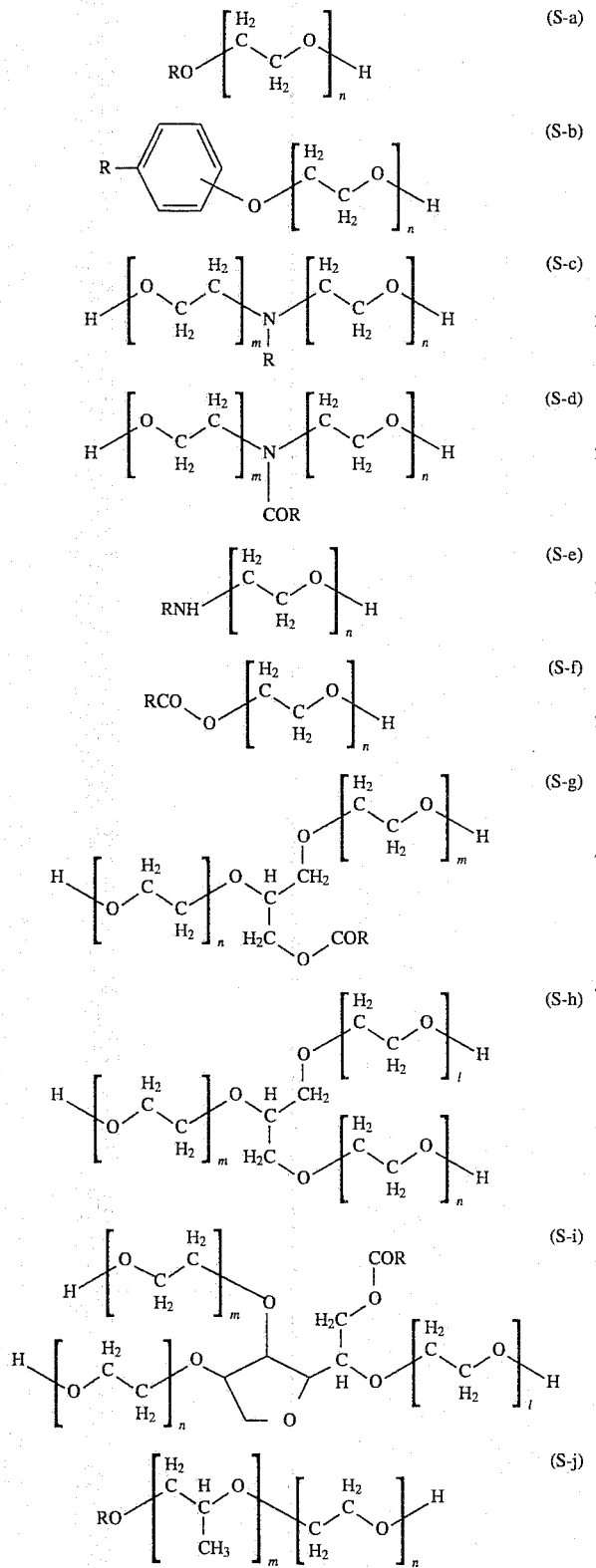

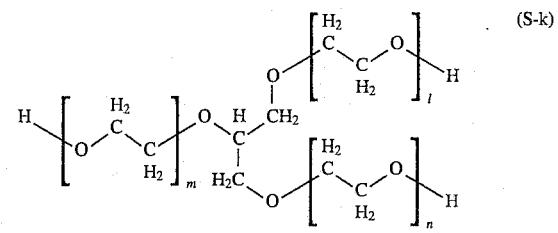

In the formulas (S-a) to (S-k), R is an alkyl group, and each of l, m and n is a natural number.

The alkyl group preferably has 4 or more carbon atoms, and more preferably has 8 or more carbon atoms. The total number of l, m and n (l+m+n) preferably is not less than 10. Each of l, m and n more preferably is not less than 10.

Examples of the ethylene oxide nonionic surface active agents are shown below.

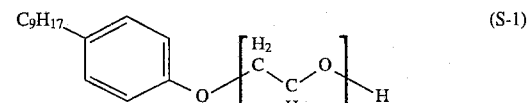

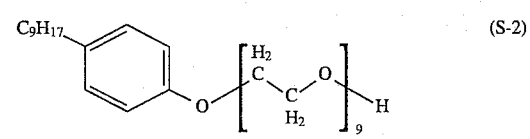

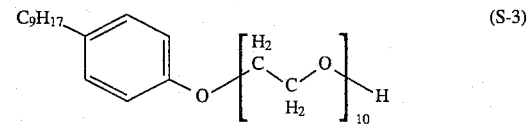

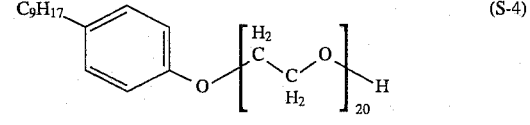

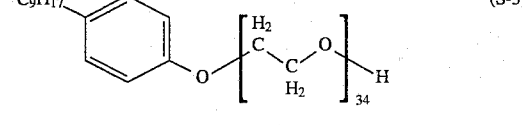

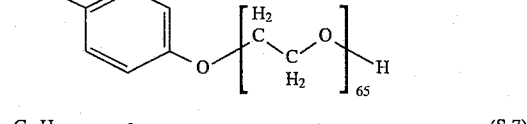

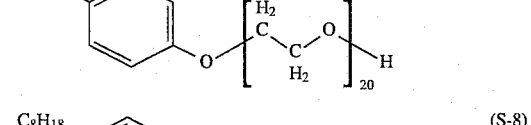

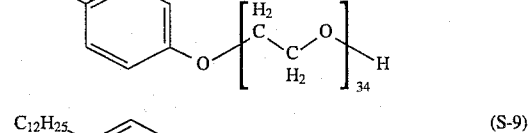

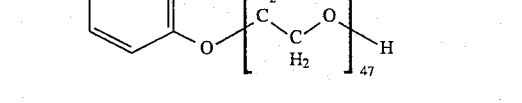

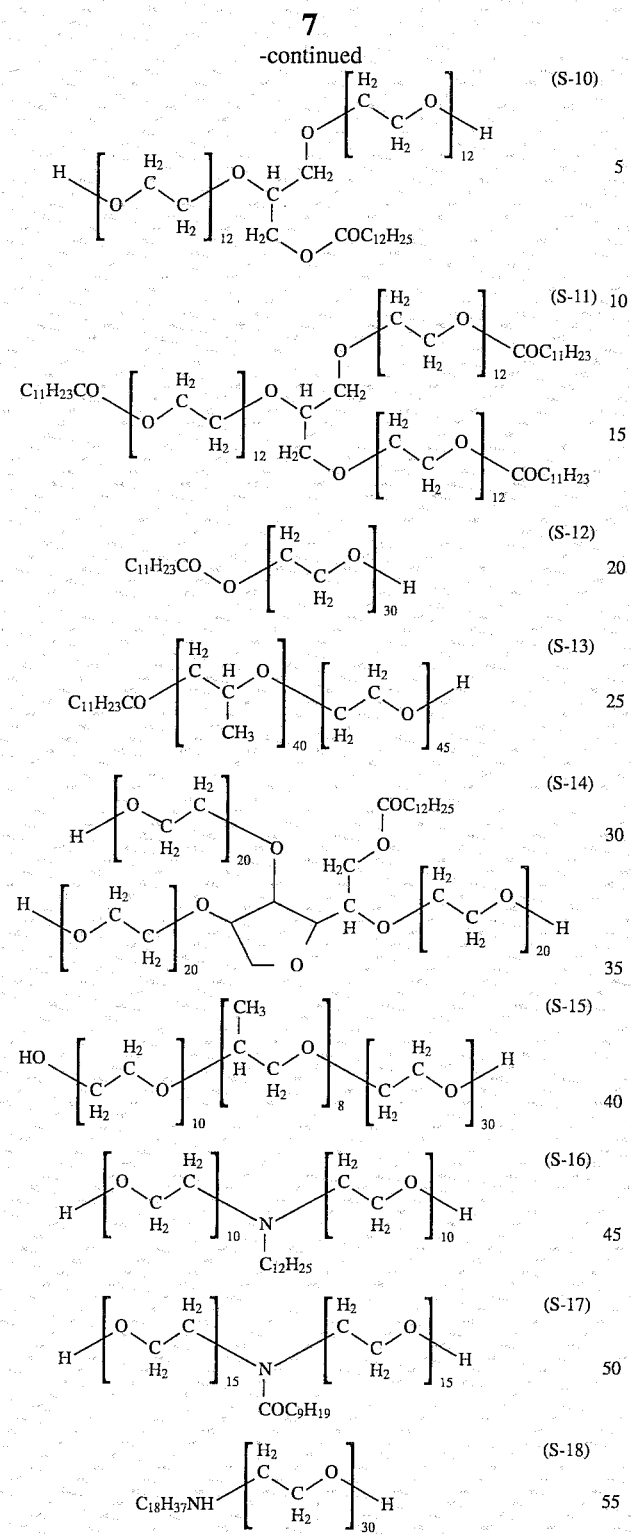

The ethylene oxide nonionic surface active agents are described in 12,093 Chemical Products No. 1,092 to No. 1,099 (written in Japanese, The Chemical Daily Co., Ltd.).

The ethylene oxide nonionic surface active agents are commercially available. Examples of the commercial products include Adecanol, Bluronick, Adicanol, Edecaestol (Asahi Electro-Chemical Co., Ltd.), Emulgen, Doween, Emanon, Amito (Kao Co., Ltd.), Emulmine, Nonipol Soft, Octapol, New Pol, Ionet (Sanyo Chemical Industries, Ltd.), Union, Rikanon (New Japan Rika Co., Ltd.), Noigen, Emuljit, Epan, Solgen, Amirazine (Dai-Ichi Kogyo Seiyaku Co., Ltd.), Pionine (Takemoro Oils & Fats Co., Ltd.), Pegnal, Nonal, Solbon (Toho Chemical Co., Ltd.), Emulex (Japan Emulsion Co., Ltd.), Nikkol (Japan Surfactant Kogyo K.K.), Nissan Nonion, Nissan Persoft, Nissan Naimine (Nippon Fats & Oils Co., Ltd.), Actinol, Sylvan, Penerol (Matsumoto Fats & Oils Chemical Co., Ltd.), Baru (Marubishi Oil Chemical Co., Ltd.), Penlex (Miyoshi Oil & Fat Co., Ltd.), Egal, Shunel (Morin Chemical Co., Ltd.), Emalox (Yoshimula Oil Chemicals Co., Ltd.), Liponox (Lion Co., Ltd.) and Sanmol (Nikka Fats a Oils, Co., Ltd.).

The amount of the ethylene oxide nonionic surface active agent is preferably in the range of 0.001 to 5 wt. %, more preferably in the range of 0.01 to 2 wt. %, and most preferably in the range of 0.05 to 0.5 wt. % based on the coating amount of the layer containing a base precursor.

Two or more ethylene oxide nonionic surface active agents can be used in combination.

Polyvinyl alcohol (II)

The second embodiment of the present invention uses a modified polyvinyl alcohol (II). The polyvinyl alcohol (II) is a block copolymer consisting of vinyl alcohol units and hydrophobic units which are more hydrophobic than the vinyl alcohol units.

The polyvinyl alcohol (II) can be synthesized by copolymerizing the end of a polyvinyl alcohol with the hydrophobic units. The polyvinyl alcohol may be partially saponified.

A block copolymer of a polyvinyl alcohol has been known. For example, Polymer Articles, volume 149, page 855 (1992) describes the synthesis and the characters of the block copolymer of the polyvinyl alcohol.

In more detail, the block copolymer is synthesized by a radical polymerization of vinyl acetate in the presence of a thiol compound such as thiocarboxylic acid, and saponification of the obtained polyvinyl acetate. Thus, a polyvinyl alcohol having a thiol group at the end of the main chain is obtained. This reaction is shown below.

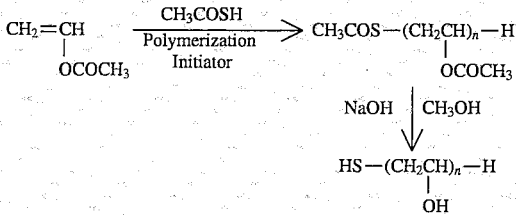

The obtained polyvinyl alcohol having the terminal thiol is further polymerized with another monomer by a radical initiator of a redox system to form the block copolymer, namely the polyvinyl alcohol (II). The radical polymerization of a redox system is well known, and can be easily conducted. The reaction is shown below.

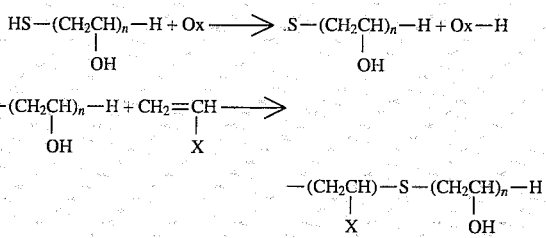

The vinyl alcohol units in the copolymer preferably have a saponification degree of not less than 60%, more preferably not less than 70%, and most preferably not less than 80%.

The other units in the copolymer are more hydrophobic than the vinyl alcohol units. The term "hydrophobic" is relatively defined. Accordingly, the hydrophobic units in the present invention include units which are usually referred to as hydrophilic (e.g., acrylic acid). The polyvinyl alcohol (II) is a block copolymer consisting of very hydrophilic vinyl alcohol units and relatively hydrophobic units. Accordingly, the block copolymer can function as a dispersing agent of the base precursor.

The hydrophobic units preferably have such a character that the homopolymer of the units (e.g., the homopolymer having the polymerization degree of 1,000) is water-insoluble. The effect of the present invention can be obtained by introducing a relatively small amount (e.g., not more than 20 mol %) of the units having the character into the polyvinyl alcohol (II).

The hydrophobic units are contained in the polyvinyl alcohol (II) preferably in the amount of 1 to 50 mol %, more preferably in the amount of 3 to 30 mol %, and most preferably in the amount of 5 to 20 mol %.

The polyvinyl alcohol (II) preferably has a polymerization degree (the sum of the degrees of the vinyl alcohol units and the hydrophobic units) of not less than 100, more preferably not less than 200, and most preferably not less than 300. The upper limit of the polymerization degree is usually about 3,000.

Various monomers are available as the (relatively) hydrophobic units because the vinyl alcohol units are very hydrophilic. Ethylenically unsaturated monomers are preferred to synthesize the copolymer according to the above-described reaction formulas.

Examples of the ethylenically unsaturated monomers include acrylic acid and derivatives thereof (e.g., acrylamide, N,N-dimethylacrylamide, methyl acrylate, ethyl acrylate, n-propyl acrylate, iso-propyl acrylate, butyl acrylate), methacrylic acid and derivatives thereof (e.g., methacrylamide, N,N-dimethacrylamide, methyl methacrylate, ethyl methacrylate, n-propyl methacrylate, iso-propyl methacrylate, butyl methacrylate, N,N-dimethylaminoethyl methacrylate, N,N-diethylaminoethyl methacrylate), acrylonitrile, methacrylonitrile, maleic acid and derivatives thereof, iraconic acid and derivatives thereof, styrene and derivatives thereof, vinyl ethers and derivatives thereof, vinyl esters and derivatives thereof, allyl ethers and derivatives thereof, allyl esters and derivatives thereof, and N-vinyl heterocyclic compounds. The above-mentioned derivatives include a salt, an amide and an ester.

Examples of the polyvinyl alcohol (II) are shown in Table 1.

TABLE 1

| PVA | VA units | | | Hydrophobic units |
|---|---|---|---|---|
| (II) | S deg. | P deg. | Monomer | P deg. |
| (II-1) | 98.0 | 250 | Ethyl acrylate | 20 |
| (II-2) | 98.0 | 250 | N,N-dimethylaminoethyl methacrylate | 25 |
| (II-3) | 98.0 | 250 | Acrylonitrile | 10 |
| (II-4) | 98.0 | 250 | Acrylamide | 50 |
| (II-5) | 98.0 | 250 | Acrylic acid | 40 |
| (II-6) | 98.0 | 400 | Styrene | 15 |
| (II-7) | 96.5 | 250 | Methyl methacrylate | 20 |
| (II-8) | 96.5 | 300 | Methacrylamide | 45 |
| (II-9) | 88.0 | 250 | Methacrylic acid | 40 |
| (II-10) | 88.0 | 500 | Methyl methacrylate | 20 |

(Remark)
VA units: Vinyl alcohol units
S deg.: Saponification degree
P deg.: Polymerization degree The amount of the polyvinyl alcohol (II) is preferably in the range of 0.1 to 20%, more preferably in the range of 0.5 to 10%, and most preferably in the range of 1 to 5% based on the solid content of the layer containing the base precursor.

Two or more polyvinyl alcohols (II) can be used in combination.

Polyvinyl alcohol (V)

In the second embodiment, the polyvinyl alcohol (II) is preferably used in combination with a polyvinyl alcohol (V) having a high saponification degree (not less than 80%).

The polyvinyl alcohol (V) has a saponification degree preferably of not less than 90%, more preferably of not less than 95%, and most preferably of not less than 97%. The polyvinyl alcohol (V) can function as a binder of the layer containing the base precursor.

The polyvinyl alcohol (V) has a polymerization degree preferably in the range of 100 to 3,000, more preferably in the range of 150 to 2,500, and most preferably in the range of 200 to 2,000.

The polyvinyl alcohol (V) may have an acidic group or a salt thereof in its molecule. The introduced acidic group or the salt prevents crystallization of the polyvinyl alcohols at a high temperature.

The amount of the polyvinyl alcohol (V) is preferably in the range of 40 to 95%, more preferably in the range of 50 to 93%, and most preferably in the range of 60 to 90% based on the solid content of the layer containing the base precursor.

In the case that the polyvinyl alcohol (V) is used, the amount of the polyvinyl alcohol (II) is preferably in the range of 0.1 to 20 wt. %, more preferably in the range of 0.5 to 10 wt. %, and most preferably in the range of 1 5 wt. % based on the amount of the polyvinyl alcohol (V).

Two or more polyvinyl alcohols (V) can be used in combination.

Polyvinyl alcohol (III)

In the third embodiment, the polyvinyl alcohol (III) is used in combination with the polyvinyl alcohol (IV).

The polyvinyl alcohol (III) has a saponification degree of not less than 95%. The saponification degree is preferably not less than 96%, and more preferably is not less than 97%.

The polyvinyl alcohol (III) has a polymerization degree preferably in the range of 100 to 3,000, more preferably in the range of 150 to 2,500, and most preferably in the range of 200 to 2,000.

The amount of the polyvinyl alcohol (III) is preferably in the range of 40 to 95%, more preferably in the range of 50 to 93%, and most preferably in the range of 60 to 90% based on the solid content of the layer containing the base precursor.

The polyvinyl alcohol (III) is commercially available. Examples of the commercial products include PVA-105, PVA-110, PVA-107, PVA-117H, PVA-120, PVA-124, PVA-124H, PVA-CS, PVA-CST, PVA-HC, KM-118 (Kuraray Co., Ltd.), Gosenol NH-26, NH-20, NH-18, N-300, NM-14, NM-11, NL-05, AH-26, AH-17, A-300, C-500 and NH-18S (Nippon Synthetic Chemical Industry Co., Ltd.).

Two or more polyvinyl alcohols (III) can be used in combination.

Polyvinyl alcohol (IV)

The polyvinyl alcohol (IV) has a saponification degree of less than 95%. The saponification degree is preferably in the range of 60 to 94%, and more preferably in the range of 70 to 90%.

Further, the polyvinyl alcohol (IV) has a block character of not more than 0.5. The block character is described below.

A characteristic of a partially saponified polyvinyl alcohol depends on not only the amount of the remaining acetic units but also the distribution of the units. The distribution of the remaining acetic units can be represented by the block character ($\eta$). The block character is used to define a character of a second dimensional copolymer. The block character is described in Poval, pages 246 to 249 (written in Japanese, Kobunshi Kanko-kai).

The block character (η) is defined by the following formula.

$$\eta = \frac{(OH, OAc)}{2 \cdot (OH) \cdot (OAc)}$$

wherein (OH) is the saponification degree of the polyvinyl alcohol (mol %), (OAc) is the amount (mol %) of the remaining acetic groups, and (OH,OAc) is the ratio of the partial structure consisting of a remaining acetic group and a neighboring OH group.

The block character (η) is in the range of 0 to 2. The relation between the block character and the distribution is shown below.

Block: 0<η<1

Random: η=1

Alternative: 1<η≦2

The polyvinyl alcohol (IV) has a block character (η) of not more than 0.5. Accordingly, the remaining acetic units are remarkably blocked in the polyvinyl alcohol (IV).

The synthesis of the blocked partially saponified polyvinyl alcohol has been known, and is described in various documents such as the above-mentioned Poval. The polyvinyl alcohol (IV) is usually obtained by saponifying polyvinyl acetate directly.

The polyvinyl alcohol (IV) has a polymerization degree preferably of not less than 100, more preferably of not less than 200, and most preferably of not less than 300. The upper limit of the polymerization degree is usually 3,000.

Examples of the polyvinyl alcohols (IV) are shown below. The following examples are obtained by saponifying polyvinyl acetate directly.

TABLE 2

| Polyvinyl alcohol (IV) | Block character (η) | Saponification degree | Polymerization degree |
| --- | --- | --- | --- |
| (IV-1) | 0.50 | 88% | 1,000 |
| (IV-2) | 0.46 | 82% | 1,500 |
| (IV-3) | 0.48 | 85% | 700 |
| (IV-4) | 0.47 | 90% | 850 |
| (IV-5) | 0.42 | 75% | 1,200 |
| (IV-6) | 0.50 | 77% | 2,000 |
| (IV-7) | 0.40 | 76% | 1,000 |

The amount of the polyvinyl alcohol (IV) is preferably in the range of 0.1 to 20%, more preferably in the range of 0.5 to 10%, and most preferably in the range of 1 to 5% based on the solid content of the layer containing the base precursor.

The amount of the polyvinyl alcohol (IV) is usually not more than 20 wt. %, preferably in the range of 0.1 to 20 wt. %, more preferably in the range of 0.5 to 10 wt. %, and most preferably in the range of 1 to 5 wt. % based on the amount of the polyvinyl alcohol (III).

Two or more polyvinyl alcohols (IV) can be used in combination.

Layered structure of light-sensitive material

The light-sensitive material of the present invention comprises at least two layers provided on a support.

The layered structure of the light-sensitive material can be determined according to use of the material. In the case that the light-sensitive material is used for the preparation of a lithographic plate or a color proof, the two or more layers preferably may consist of a light-sensitive layer containing silver halide and a base precursor and a hardening layer containing an ethylenically unsaturated polymerizable compound or a cross-linkable polymer. Further, the layers may consist of a light-sensitive layer containing silver halide, a hardening layer containing an ethylenically unsaturated polymerizable compound or a cross-linkable polymer and a overcoating layer containing a base precursor. The reducing agent can be contained in the light-sensitive layer, the hardening layer or the overcoating layer. The light-sensitive material may have other optional layers such as an adhesive layer and a strippable layer.

The hardening layer is preferably provided between the support and the layer containing the base precursor.

The layered structure is further described referring to the drawings.

FIG. 1 is a sectional view schematically illustrating an embodiment of a silver halide light-sensitive material of the present invention.

As is shown in FIG. 1, the silver halide light-sensitive material comprises a support (1), a hardening layer (2), a light-sensitive layer (3) and an overcoating layer (4) in that order. The hardening layer (2) contain an ethylenically unsaturated polymerizable compound (11) and a cross-linkable polymer (12). The light-sensitive layer (3) contains silver halide (13) and a reducing agent (14). The overcoating layer (4) contains a base precursor (15) and a specific polyvinyl alcohol (16).

Figure 2:
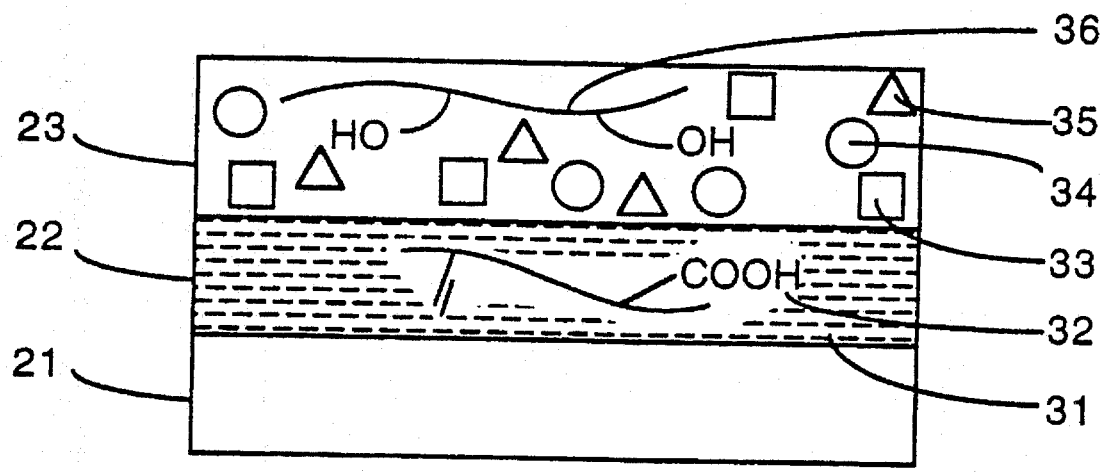
FIG. 2 is a sectional view schematically illustrating another embodiment of a silver halide light-sensitive material of the invention.

FIG. 2 is a sectional view schematically illustrating another embodiment of a silver halide light-sensitive material of the invention.

As is shown in FIG. 2, the silver halide light-sensitive material comprises a support (21), a hardening layer (22) and a light-sensitive layer (23). The hardening layer (22) contain an ethylenically unsaturated polymerizable compound (31) and a cross-linkable polymer (32). The light-sensitive layer (23) contains silver halide (33), a reducing agent (34), a base precursor (35) and a specific polyvinyl alcohol (36).

Support

The support can be made of a paper, a synthetic paper, a paper laminated with a synthetic resin (e.g., polyethylene, polypropylene, polystyrene), a plastic film (e.g., polyethylene terephthalate, polycarbonate, polyimide, Nylon, cellulose triacetate), a metal plate (e.g., aluminum, aluminum alloy, zinc, iron, copper) or a paper or plastic film laminated with the metal. Further, the metal can be evaporated onto the paper or plastic film to form the support.

In the case that the light-sensitive material is used for the preparation of a lithographic plate, the support is preferably made of an aluminum plate, a polyethylene terephthalate film, a polycarbonate film, a paper or a synthetic paper. A complex sheet can also be available. For example, an aluminum sheet can be laminated on the polyethylene terephthalate film.

Aluminum support is particularly preferred. The aluminum support preferably has a thickness in the range of 0.1 to 0.5 mm.

The aluminum support is preferably treated to form a rough surface (graining treatment) or a hydrophilic surface.

The treatment for the rough surface can be conducted by an electrochemical graining treatment and/or a mechanical graining treatment. According to the electrochemical graining treatment, a current passes through an aluminum plate in an electrolytic solution of hydrochloric acid or nitric acid. The mechanical graining treatment includes a wire brushing method, a ball graining method and a brash graining method. In the wire brushing method, the surface of aluminum plate is scratched with a metal wire. In the ball graining method, the surface of aluminum plate is grained with graining balls and a graining agent. In the brash graining method, the surface is grained with a Nylon brash and a graining agent.

The grained aluminum plate is then chemically etched with an alkali or an acid. An alkali etching method is industrially advantageous. Examples of the alkali agents include sodium carbonate, sodium aluminate, sodium metasilicate, sodium phosphate, sodium hydroxide, potassium hydroxide and lithium hydroxide. The alkali solution preferably has a concentration in the range of 1 to 50 wt. %. The temperature of the alkali treatment is preferably in the range of 20° to 100° C. The treatment conditions are preferably so adjusted that the amount of the dissolved aluminum is in the range of 5 to 20 g/m².

The aluminum plate is usually washed with an acid to remove smut from the surface after the alkali etching treatment. Examples of the acids include nitric acid, sulfuric acid, phosphoric acid, chromic acid, hydrofluoric acid and borofluoric acid.

The smut removing treatment can also be conducted after the electrochemical graining treatment according to a conventional method. For example, an aluminum plate can be treated with 15 to 65 wt. % sulfuric acid at a temperature in the range of 50° to 90° C.

The surface treated aluminum plate can be subjected to an anodizing treatment or a chemical treatment. The anodizing treatment can be conducted according to a conventional method. In more detail, a direct or alternative current passes through an aluminum plate in a solution of an acid to form an anodic oxide layer on the surface of the plate. Examples of the acids include sulfuric acid, phosphoric acid, chromic acid, oxalic acid, sulfamic acid and benzenesulfonic acid. The conditions of the anodizing treatment depend on the contents of the electrolytic solution. The concentration of the electrolytic solution is preferably in the range of 1 to 80 wt. %, the temperature of the solution is preferably in the range of 5° to 70° C., the current density is preferably in the range of 0.5 to 60 A/dm2, the voltage is preferably in the range of 1 to 100 v, and the time for the electrolysis is preferably in the range of 10 to 100 seconds.

The anodizing treatment is preferably conducted in sulfuric acid at a high current density. Phosphoric acid is also preferably used for the anodizing treatment.

After the anodizing treatment, the aluminum plate can be treated with an alkali metal silicate. For example, the aluminum plate can be immersed in an aqueous solution of sodium silicate. An undercoating layer can be provided on the aluminum support to improve the adhesion between the support and the hardening layer or to improve a printing character.

Undercoating layer

Examples of the components of the undercoating layer include a polymer (e.g., casein, polyvinyl alcohol, ethyl cellulose, phenol resin, styrene-maleic anhydride resin, polyacrylic acid), an amine (e.g., monoethanol amine, diethanol amine, triethanol amine, tripropanol amine) and a salt thereof (e.g., chloride, oxalate, phosphate), an monoaminonomonocarboxylic acid (aminoacetic acid, alanine), an oxyamino acid (serine, threonine, dihydroxyethylglycine), a sulfur containing amino acid (e.g., cysteine, cystine), a monoaminodicarboxylic acid (e.g., aspartic acid, glutamic acid), an amino acid having an aromatic ring (e.g., p-hydroxylphenylglycine, phenylalanine, anthranilic acid), an aliphatic aminosulfonic acid (e.g., sulfamic acid, cyclohexylsulfamic acid) and a (poly)aminopolyacetic acid (e.g., ethylenediaminetetraacetic acid, nitrilotriacetic acid, iminodiacetic acid, hydroxyethyliminodiacetic acid, hydroxyethylethylenediamineacetic acid, ethylenediaminediacetic acid, cycloethylenediaminetetraacetic acid, diethylenetriaminepentaaceitic acid, glycoletherdiaminetetraacetic acid). All or a part of the acidic groups of the above-mentioned compound may form a salt (e.g., sodium salt, potassium salt, ammonium salt). Two or more components can be used in combination.

Light-sensitive layer

The light-sensitive layer contains silver halide, which forms a radical after an exposing step and a developing step. The formed radical is transferred to a hardening layer to cause a hardening reaction.

The light-sensitive layer preferably has a thickness in the range of 0.1 to 20 µm, and more preferably in the range of 0.5 to 10 µm.

Hardening layer

The hardening layer contains an ethylenically unsaturated polymerizable compound or a cross-linkable polymer. The hardening layer is hardened by a polymerization reaction or a cross-linking reaction.

The hardening layer preferably has a thickness in the range of 0.1 to 20 µm, and more preferably in the range of 0.3 to 7 µm.

Overcoating layer and image formation accelerating layer

An overcoating layer has a function of preventing oxygen in the air from permeating into the hardening layer. Oxygen functions as a polymerization inhibitor. Accordingly, the hardness of the hardening layer can be improved by providing the overcoating layer. The overcoating layer can also function as a protective layer. The image formation accelerating layer contains a component (e.g., a base precursor, a reducing agent, a heat development accelerator) which accelerates an image forming reaction. The image formation accelerating layer has another function of the above-mentioned overcoating layer.

These layers may contain a matting agent, which has a function of reducing adhesion on the surface of the silver halide light-sensitive material to prevent adhesion when the materials are stacked.

The overcoating layer or the image formation accelerating layer is usually made of a hydrophilic polymer. The layer preferably has a thickness in the range of 0.3 to 20 µm, and more preferably in the range of 0.5 to 10 µm.

Adhesive layer

An adhesive layer can be provided in the silver halide light-sensitive material to form a toner image. The adhesive layer contains a polymer, to which toner particles adhere.

The adhesive polymer preferably is a natural or synthetic rubber. Examples of the synthetic rubbers include polyisobutylene, nitryl rubber, butyl rubber, chlorinated rubber, polyvinyl isobutyl rubber, silicon elastomer, neoprene and a copolymer rubber (e.g., styrene-butadiene copolymer, styrene-isobutylene copolymer). The copolymer may be any of a random copolymer, a block copolymer and a graft copolymer.

The adhesive layer preferably has a thickness in the range of 0.01 to 10 µm, and more preferably in the range of 0.05 to 5 µm.

Strippable layer

A strippable layer can be provided in the silver halide light-sensitive material to form a transferred image.

The strippable layer is not adhesive at room temperature so that it is easily removed from the support. The layer is usually adhesive at an elevated temperature. The strippable layer usually contains an organic polymer (e.g., polyvinyl acetal resin, polyamide resin) as matrix. The matrix polymer preferably has a flow softening point that is higher than a heating temperature required for developing silver halide.

The strippable layer preferably contains a fluorine compound in an amount of not less than 1 wt. %. A fluorine surface active agent is preferably used as the fluorine compound. The strippable layer preferably has a thickness of not less than 1.0 μm, and more preferably of not less than 1.4 μm.

Intermediate layer

An intermediate layer can be provided between the layers. The intermediate layer can function as an antihalation layer or a barrier layer. The barrier layer prevents components from moving between layers when the light-sensitive material is stored. The composition of the intermediate layer is determined according to its function. The intermediate layer can be made of a hydrophilic polymer used in the light-sensitive layer or the overcoating layer.

The intermediate layer preferably has a thickness of not more than 10 μm.

Silver halide

Silver halide is silver chloride, silver bromide, silver iodide, silver chlorobromide, silver chloroiodide, silver iodobromide or silver chloroiodobromide in the form of grains.

The crystal forms of silver halide grains preferably are cubic or tetradecahedron. In addition to these regular crystals, irregular forms and mixed forms are available. Examples of the irregular forms include a potato-like form, a spherical form and a tabular form. The tabular form usually has an aspect ratio (diameter per thickness) of 5 or more.

The silver halide grains may be extremely small grains having a grain diameter (diameter of projected area) of less than 0.01 μm. The grains may also be relatively large grains having a diameter of more 10 μm. The silver halide emulsion may be a polydispersed emulsion or a monodispersed emulsion. The monodispersed emulsion is described in U.S. Pat. Nos. 3,574,628 and 3,655,394 and British Patent No. 1,413,748.

With respect to the crystal structure of the silver halide grains, the individual grains may have a homogeneous halogen composition or a heterogeneous halogen composition. In the heterogeneous composition, the composition varies from the outer surface portion to the inside portion. The grains may have a multi-layered structure. Further, the silver halide grains may be bonded with other silver halide grains having different halogen composition through epitaxial bonding. The grains may be bonded with compounds other than the silver halide such as silver rhodanate and lead oxide.

Various substances in the form of salt can be added to the silver halide. Examples of the substances include copper, thallium, lead, cadmium, zinc, chalcogens (e.g., sulfur, selenium, tellurium), gold, and noble metals of group VIII (e.g., rhodium, iridium, iron, platinum, palladium). The salts are added to the emulsion at the grain formation or after the grain formation according to a conventional process. The conventional process is described in U.S. Pat. Nos. 1,195,432, 1,191,933, 2,448,060, 2,628,167, 2,950,972, 3,488,709, 3,737,313, 3,772,031, 4,269,927 and Research Disclosure (RD), 13,452 (June 1975).

The silver halide grains can be doped with iridium ion by adding an aqueous solution of an iridium compound to a silver halide emulsion. Examples of water-soluble iridium compounds include hexachloroiridic(III) salts and hexachloroiridic(IV) salts. The silver halide grains can also be doped with rhodium ion by adding an aqueous solution of a rhodium compound to a silver halide emulsion. Examples of water-soluble rhodium compounds include rhodium ammonium chloride, rhodium trichloride and rhodium chloride.

The iridium compound or the rhodium compound can be dissolved in a halide solution for forming silver halide grains. The aqueous solution of the iridium compound or the rhodium compound can be used before or after the grain formation. Further, the solution can be added to the emulsion between the grain formation and a chemical sensitization. The solution is preferably added at the stage of the grain formation. The iridium or rhodium ion is preferably used in an amount of $10^{-8}$ to $10^{-3}$ mol, and more preferably in an amount of $10^{-7}$ to $10^{-5}$ mol based on 1 mol of silver halide. In the case that iridium compound and the rhodium compound are used in combination, the rhodium compound is preferably added to the emulsion before the addition of the iridium compound.

Two or more kinds of silver halide grains that differ in halogen composition, crystal habit, grain size, or other features from each other can be used in combination.

The silver halide is preferably used in the form of an emulsion. The silver halide emulsion can be prepared by known processes, which are described in Research Disclosure (RD), No. 17,643, pages 22 to 23 (December 1978), (Emulsion preparation and types); and Research Disclosure, No. 18,716, p. 648, (November 1979).

The silver halide emulsion is generally used after a physical ripening and a chemical sensitization.

Various additives can be used in the ripening or sensitizing steps. The additives are described in Research Disclosure, No. 17,643 and No. 18,716. The chemical sensitizer is described in No. 17,643 (page 23) and No. 18,716 (page 648, right column). Other additives are also described in Research Disclosure. For example, a sensitivity-increasing agent is described in No. 18,716 (page 648, right column). An anti-fogging agent and a stabilizer are described in No. 17,643 (pages 24 to 25) and No. 18,716 (page 649, right column), respectively.

The silver halide emulsion is usually subjected to a spectral sensitization. Various spectral sensitizing dyes are known in a conventional silver halide photography. Examples of the sensitizing dyes include cyanine dyes, merocyanine dyes, complex merocyanine dyes, holopolar cyanine dyes, hemicyanine dyes, styryl dyes and hemioxonol dyes.

A supersensitizer can be added to the emulsion in addition to the sensitizing dye. The supersensitizer itself has neither a spectral sensitization effect nor an absorption of visible light, but shows a supersensitizing effect on the sensitizing dye.

Organic metallic salt

An organic metallic salt can be added to the light-sensitive layer containing silver halide. An organic silver salt is particularly preferred.

Examples of organic moieties of the salts include triazoles, tetrazoles, imidazoles, indazoles, thiazoles, thiadiazoles, azaindenes. An aliphatic, aromatic or heterocyclic compound having a mercapto group is also available as the organic moiety. Further, silver carboxylates and acetylene silver are available as the organic silver salt. Two or more organic metallic salts can be used in combination.

The organic silver salt is generally used in an amount of $10^{-5}$ to 10 mol, and preferably $10^{-4}$ to 1 mol based on 1 mol of silver halide. A similar effect can be obtained by adding the organic moiety of the organic metallic salt in place of the salt itself to the light-sensitive layer containing silver halide. The organic moiety can partially react with the silver halide to form the organic metallic salt.

Reducing agent

The reducing agent has a function of reducing the silver halide or a function of accelerating (or inhibiting) a hardening reaction of the polymerizable compound or the cross-linkable polymer. There are known various reducing agents having the functions. Examples of the reducing agents include hydroquinones, catechols, p-aminophenols, p-phenylenediamines, 3-pyrazolidones, 3-aminopyrazoles, 4-amino- 5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

The reducing agents (including compounds referred to as developing agent or hydrazine derivative) are described in Japanese Patent Provisional Publications 61(1986)-183640, No. 61(1986)-183535, No. 61(1986)-228441, No. 62(1987)-70836, No. 61(1987)-86354, No. 62(1987)-86355, No. 62(1987)-206540, No. 62(1987)-264041, No. 62(1987)-109437 and No. 63(1988)-254442, and Japanese Patent Applications No. 63(1988)-97379, No. 63(1988)-296774, No. 63(1988)-296775, No. 1(1989)-27175, No. 1(1989)-54101 and No. 1(1989)-91162. The reducing agents are also described in T. James, The Theory of the Photographic Process, 4th edition, pages 291 to 334 (1977), Research Disclosure, Vol. 170, No. 17029, pages 9 to 15 (June 1978), and Research Disclosure, Vol. 176, No. 17643, pages 22 to 31 (Dec. 1978). Further, a reducing agent precursor is also available. The precursor can release a reducing agent under heating or in contact with a base.

When the reducing agent is basic, that is, it forms a salt with an acid, the reducing agent can be used in the form of a salt with an acid. The reducing agents can be used singly or in combination. Certain interactions between those reducing agents may be expected where two or more reducing agents are used in combination. One of the interactions is for an acceleration of reduction of silver halide (or an organic silver salt) through so-called super-additivity. The other interaction is for a chain reaction between an oxidant of one reducing agent formed by a reduction of silver halide (or an organic silver salt) oxidation-reduction reaction and another reducing agent. The chain reaction induces or inhibits the polymerization of the polymerizable compound. Both interactions may occur simultaneously. Thus, it is difficult to determine which of the interactions has occurred in practical use.

The reducing agent is used in an amount of 0.1 to 10 mol, and more preferably 0.25 to 2.5 mol based on 1 mol of silver halide.

By adjusting the kind or amount of the above reducing agent, the polymerizable compound or the cross-linkable polymer can be hardened within the area where a latent image of the silver halide has been formed.

The reducing agent itself can be oxidized to form an oxidation product when the reducing agent develops silver halide. In the case that the oxidation product is decomposed in the layer to form a radical, a polymerization reaction proceeds within the area where the latent image of silver halide has been formed. In this system, hydrazines are preferably used as the reducing agent.

On the other hand, the reducing agent itself or the oxidation product may have a function of inhibiting the polymerization. In this case, the oxidation product substantially does not form a radical. A polymerization is caused by a polymerization initiator within the area where the latent image of silver halide has not been formed (in the case that the inhibiting function of the oxidation product is stronger than that of the reducing agents) or has been formed (in the case that the inhibiting function of the reducing agent is stronger than that of the oxidation products). In these systems, 1-phenyl-3-pyrazolidones and hydroquinones are preferably used as the reducing agent. Further, the following polymerization initiator should be contained in the light-sensitive material of these systems.

Polymerization initiator

A thermal polymerization initiator forms a free radical by heat. The radical is added to the polymerizable compound or the cross-linkable polymer.

The thermal polymerization initiator is described in Addition Polymerization and Ring Opening Polymerization, pages 6 to 18, edited by the Editorial Committee of High Polymer Experimental Study of the High Polymer Institute, published by Kyoritsu Shuppan (1983). Examples of the thermal polymerization initiators include azo compounds (e.g., azobisisobutyronitrile, 1,1'-azobis(1-cyclohexanecarbonitrile)) and peroxides.

A photopolymerization initiator forms a free radical by light. The radical is added to the polymerizable compound or the cross-linkable polymer.

The photopolymerization initiator is described in Oster et al., Chemical Review, vol. 68, pages 125 to 151 (1968), Kosar, Light-Sensitive System, pages 158 to 193, John Wiley & Sons (1965), Japanese Patent Provisional Publications No. 61(1986)-75342 and No. 2(1990)-207254. Examples of the photopolymerization initiator include carbonyl compounds, halogen-containing compounds, redox couples of photo-reducible dye and reducing agent, organic sulfur compounds, peroxides, photo semi-conductors and metallic compounds.

The polymerization initiator is used in an amount of preferably 0.001 to 0.5 g, and more preferably 0.01 to 0.2 g based on 1 g of the total amount of the polymerizable compound and the cross-linkable polymer.

Polymerizable compound

The polymerizable compound used in the present invention has an ethylenically unsaturated group.

Examples of the ethylenically unsaturated polymerizable compounds include acrylic acids, salts of acrylic acids, acrylic esters, acryleunides, methacrylic acids, salts of methacrylic acids, methacrylic esters, methacrylamides, maleic anhydride, maleic esters, iraconic esters, styrenes, vinyl ethers, vinyl esters, N-vinyl heterocyclic compounds, allyl ethers, allyl esters, and derivatives thereof. Acrylic esters and methacrylic esters are preferred.

Examples of the acrylic esters include pentaerythritol tetraacrylate, trimethylolpropane triacrylate, dipentaerythritol hexacrylate, polyester acrylate and polyurethane acrylate.

The polymerizable compound is preferably contained in the hardening layer in an amount of 3 to 90 wt. % based on the total amount of the hardening layer. The amount is more preferably in the range of 15 to 60 wt. %. Two or more polymerizable compounds can be used in combination.

Polymer contained in hardening layer

The hardening layer can contain a cross-linkable polymer. The cross-linkable polymer can be used in combination with another (non-cross-linkable) polymer.

The cross-linkable polymer preferably has an ethylenically unsaturated bond in its main chain or side chain. The polymer may be a copolymer with another monomer.

Examples of the polymer having an ethylenically unsaturated bond in its main chain include poly-1,4-butadiene, poly-1,4-isoprene and natural or synthetic rubbers.

Examples of the polymer having an ethylenically unsaturated bond in its side chain include poly-1,2-butadiene and poly-1,2-isoprene.

Further, a polymer of acrylic or methacrylic ester or amide having a specific residue is also available as the cross-linkable polymer. The specific residue means R of —COOR (ester) or —CONHR (amide). Examples of the specific residues include —$(CH_2)_n$—$CR^1$=$CR^2R^3$, —$(CH_2O)_n$—$CH_2CR^1$=$CR^2R^3$, —$(CH_2CH_2O)_n$—$CH_2CR^1$=$CR^2R^3$, —$(CH_2)_n$—NH—CO—O—$CH_2CR^1$=$CR^2R^3$, —$(CH_2)_n$—O—CO—$CR^1$=$CR^2R^3$ and —$(CH_2CH_2O)_n$—X. In the formulas, each of $R^1$, $R^2$ and $R^3$ independently is hydrogen, a halogen atom, an alkyl group, an aryl group, an alkoxy group and aryloxy group. The number of the carbon atoms contained in $R^1$, $R^2$ or $R^3$ is not more than 20. $R^1$ and $R^2$ or $R^3$ may be combined to form a ring. In the formulas, n is an integer of 1 to 10. X is dicyclopentadienyl. Examples of the ester residues include —$CH_2CH_2O$—$CH_2CH$=$CH_2$, —$CH_2C(CH_3)$=$CH_2$, —$CH_2CH$=$CH$—$C_6H_5$, —$CH_2CH_2OCOCH$=$CH$—$C_6H_5$, —$CH_2CH_2$—NH-COO—$CH_2CH$=$CH_2$ and —$CH_2CH_2O$—X (wherein X is dicyclopentadienyl). Examples of the amide residues include —$CH_2CH$=$CH_2$, —$CH_2CH_2$—1—Y (wherein Y is cyclohexene) and —$CH_2CH_2$—OCO—CH=$CH_2$.

The cross-linkable polymer is hardened by adding a free radical to the unsaturated bond (or group). The free radical functions as a polymerization initiator or a chain extender. The polymers are cross-linked with each other directly or by a chain reaction of a polymerizable compound. The polymer can also be cross-linked by a reaction of polymer radicals, which are formed by detaching an atom of the polymers (e.g., hydrogen attached to carbon adjacent to the unsaturated bond) by a free radical.

Examples of the non-cross-linkable polymers include polyacrylic esters, polymethacrylic esters, polyvinyl acetate, polyvinyl chloride, polyvinylidene chloride, polyacrylonitrile, polymethacrylonitrile, polyethylene, polyvinyl pyridine, polyvinyl imidazole, polyvinyl butyral, polyvinyl formal, polyvinyl pyrrolidone, chlorinated polyethylene, chlorinated polypropylene, polyesters, polyamides, polyurethanes, polycarbonates, ethyl cellulose, triacetyl cellulose, diacetyl cellulose and cellulose acetate butyrate. A copolymer is also available. Two or more repeating units of the above-mentioned polymers can be used to form the copolymer.

Synthetic homopolymers and copolymers formed by an addition reaction (including various vinyl polymers) are available. Synthetic homopolymers and copolymers formed by a condensed reaction (including polyesters, polyamides, polyurethanes and mixed polymers thereof) are also available.

In the case that an alkaline solution is used to remove the unhardened area, the polymer used in the hardening layer preferably contains an acidic functional group in its molecule. Examples of the acidic functional groups include carboxyl, an acid anhydride group, phenolic hydroxyl, sulfo, sulfonamido and sulfonimido. Examples of the acidic monomers include acrylic acid, methacrylic acid, styrenesulfonic acid and maleic anhydride. The amount of the monomer having the acidic functional group is preferably in the range of 1 to 60 mol %, and more preferably in the range of 5 to 40 mol %.

The polymer of the hardening layer most preferably is a copolymer consisting of a monomer having a cross-linkable group and a monomer having an acidic group.

The molecular weight of the polymer is preferably in the range of 1,000 to 500,000. Two or more polymers may be used in combination. The content of the polymer in the hardening layer is preferably in the range of 10 to 90 wt. %, and more preferably in the range of 30 to 80 wt. %.

Hydrophilic polymer

A hydrophilic polymer is preferably added as a binder to a hydrophilic layer, such as a light-sensitive layer, an overcoating layer or an image formation accelerating layer. The polyvinyl alcohols of the present invention can function as the hydrophilic polymer.

The hydrophilic binder has a hydrophilic group or a hydrophilic bond in its molecule. Examples of the hydrophilic group include carboxyl, hydroxyl (including alcohol and phenol), sulfo, sulfonamido, sulfonimido and amido. Examples of the hydrophilic bond include urethane bond, ether bond and amido bond.

The hydrophilic binder preferably is soluble in water or swells in water. The polymer that swells in water has an affinity with water, but is not soluble in water because of the cross-linking structure of the polymer.

The natural or synthetic polymers can be used as the hydrophilic binder. The hydrophilic polymers are described in Japanese Patent Provisional Publication No. 5(1993)-249667.

Polyvinyl alcohol is preferably used as the hydrophilic polymer. Polyvinyl alcohol preferably has a high saponification degree of not less than 50%, more preferably of not less than 80% to decrease the transmission coefficient of oxygen.

A copolymerized pollvinyl alcohol is available. A copolymer of vinyl acetate and another monomer is saponified to form the denatured polyvinyl alcohol. Examples of the monomer copolymerized with the vinyl acetate include ethylene, a higher vinyl carboxylate, a higher alkyl vinyl ether, methyl methacrylate and acrylamide.

Pollvinyl alcohol may also be denatured after the saponification. Hydroxyl in polyvinyl alcohol can be modified by etheration, esterification or acetylation.

A cross-linked pollvinyl alcohol is also available. Examples of the cross-linking agents include aldehyde, methylol compounds, diisocyanate, divinyl compounds, dicarboxylic acids and inorganic agents (e.g., borates, titanium and copper).

The molecular weight of the hydrophilic polymer is preferably in the range of 3,000 to 500,000. The hydrophilic polymer binder is preferably used in an amount in the range of 0.05 g to 20 g/m$^2$, and more preferably in the range of 0.1 to 10 g/m$^2$.

Gelatin can be used in combination with another hydrophilic polymer in a light-sensitive layer containing silver halide. In this case, the difference between the pH value of the layer and the isoelectric point of the gelatin is preferably larger than 1.2.

Base precursor

The light-sensitive material preferably contains a base precursor.

Preferred examples of the base precursors include salts of organic acids with bases that is decarboxylated under heating and urea compounds which release bases under heating. Examples of the reaction mechanisms of the base precursor include a reaction between the base precursor and a salt containing anion having higher compatibility with transition metal acetylide or transition metal ion than acetylide anion, and a reaction of introducing into water both of a basic metallic compound which is hardly dissolved in water and a compound capable of reacting with metal ion of the basic metallic compound in a water medium to form a complex salt so as to release a base through a reaction between those two compounds in the presence of water.

The base precursor preferably releases a base at a temperature in the range of 50° to 200° C., and more preferably in the range of 80 to 160° C. The base precursor is preferably in the form of a water-insoluble salt.

The base precursor can be used in an amount of preferably 0.1 to 20 mol, and more preferably 0.2 to 10 mol based on 1 mol of silver halide.

Heat development accelerator

The light-sensitive material can contain a heat development accelerator. The heat development accelerator may be contained in any layers of the light-sensitive material. The heat development accelerator has a function of increasing the plasticity of a polymer (contained in the hardening layer or the light-sensitive layer). The accelerator has another function of accelerating the dispersion of the components in the layers when it is dissolved by heat of the development process.

The heat development accelerator has been known as a plasticizer. The known plasticizers are described in Plastic Additives (written in Japanese), pages 21 to 63 (Taisei-sha); Plastics Additives, Second Edition; Hanser Publishers, Chapter 5, pages 251 to 296; Thermoplastic Additives, Marcel Dekker Inc., Chapter 9, pages 345 to 379; Plastic Additives, An Industrial Guide, Noyes Publications, Section 14, pages 333 to 485: The Technology of Solvents and Plasticizers, John Wiley & Sons, Inc., Chapter 15, pages 903 to 1027; Industrial Plasticizers, Pergamon Press; Plasticizer Technology, Vol. 1, Reinhold Publishing corp.; and Plasticization and Plasticizer Process, American Chemistry.

Examples of the heat development accelerator include glycols (e.g., diethylene glycol, dipropylene glycol), polyhydric alcohols (e.g., glycerol, butanediol, hexanediol), saccharides, formates, ureas (e.g., urea, diethylurea, ethyleneurea, propyleneurea), a urea resin, a phenol resin, amides (e.g., acetamide, propionamide) and sulfonamides. Two or more heat development accelerators can be used in combination. The heat development accelerators can be added to two or more layers of the light-sensitive material.

The amount of the heat development accelerator is preferably in the range of 0.05 to 2 g/m$^2$, and more preferably in the range of 0.1 to 1 g/m$^2$.

Colorant

The light-sensitive material may contain a colorant. The colorant can function as an antihalation or antiirradiation dye. Further, a hardened image can be colored by the colorant. Various known dyes and pigments are available as the colorant provided that the colorant does not affect the sensitivity and the developing reaction of silver halide. The colorant can be contained in the hardening layer in the case that the colorant is used to function as an antihalation dye or to color a hardened image. The colorant can also be contained in the light-sensitive layer in the case that the colorant is used to function as an antiirradiation dye. The hue of the antihalation or antiirradiation dye is preferably adjusted within the sensitive light region of silver halide.

The pigments are described in various publications such as Japanese Patent Provisional Publication No. 5(1993)-249667, Handbook of Color Index and New Handbook of Pigments, Nippon Ganryo Gijutsu Kyokai (1977).

The antiirradiation dyes are described in Japanese Patent Publications No. 41(1966)-20389, No. 43(1968)-3504, No. 43(1968)-13168, Japanese Provisional Publications No. 2(1990)-39042, U.S. Pat. Nos. 2,865,752, 3,423,207, 3,697,037, and British Patents No. 1,030,392, No. 1,100,546.

The amount of the colorant is usually in the range of 0.01 to 2 g/m$^2$, and preferably in the range of 0.05 to 1 g/m$^2$.

The other additives

The light-sensitive material can contain the other additives such as an antifogging agent, a silver development accelerator and a stabilizer. Examples of these compounds include azoles, azaindenes, nitrogen-containing carboxylic acids, phosphoric acids, acetylene compounds and sulfonamides. The azoles and the azaindenes are described in Research Disclosure pages 24 to 25 (1978). The nitrogen-containing carboxylic acids and the phosphoric acids are described in Japanese Patent Provisional Publication No. 59(1984)-168442. The acetylene compounds are described in Japanese Patent Provisional Publication No. 62(1987)-87957. The sulfoamides are described in Japanese Patent Provisional Publication No. 61(1987)-178232.

An aromatic (having a carbon or heterocyclic ring) mercapto compound can also be used as an antifogging agent or a development accelerator. An aromatic heterocyclic mercapto compound, particularly a mercapto triazole derivative is preferred. The mercapto compound can be used in the form of a mercapto silver (silver salt).

These compounds are generally used in an amount of $10^{-7}$ to 1 mol based on 1 mol of the silver halide.

Development stopping agent

The development stopping agent can be used in the light-sensitive material to obtain a clear image constantly regardless of the temperature and time for the development process. The development stopping agent can be a compound having a function of neutralizing a base or reacting with a base to reduce the base concentration in the layer to stop development. The agent can also be a compound having a function of mutually reacting with silver or a silver salt to suppress development, after the appropriate development. Examples of the development stopping agents include acid precursors capable of releasing acids upon heating, electrophilic compounds capable of undergoing substitution reaction with a coexisting base upon heating, nitrogen-containing heterocyclic compounds, mercapto compounds, and precursors thereof. The development stopping agent is described in Japanese Patent Provisional Publications No. 62(1987)-253159, No. 2(1990)-42447 and No. 2(1990)-262661.

Surface active agent

A surface active agent may be contained in a layer of the light-sensitive material. Various nonionic, anionic, cationic or fluorine surface active agents are available. The surface active agent is described in Japanese Patent Provisional Publication No. 2(1990)-195356. Sorbitan, polyoxyethylene and a fluorine-containing compound are preferred.

Matting agent

A matting agent can be added to a back layer, an overcoating layer or an image formation accelerating layer to prevent adhesion of between two light-sensitive materials when the materials are superposed.

Inorganic or organic solid particles are available as the matting agent. The particles are well known in silver halide photography.

Examples of the matting agents include oxides (e.g., silicon dioxide), alkali earth metal salts, natural polymers (e.g., starch, cellulose) and synthetic polymers.

The average particle size of the matting agent is preferably in the range of 1 to 50 μm. The amount of the matting agent is preferably in the range of 0.01 to 1 g/m$^2$, and more preferably in the range of 0.1 to 0.7 g/m$^2$.

Polymerization inhibitor

A polymerization inhibitor may be added to the hardening layer to prevent the dark reaction. Various known polymerization inhibitors are available. Examples of the polymerization inhibitors include nitrosoamines, ureas, thioureas, thioamides, phenol derivatives and amines.

Exposing step

The wavelength of the light corresponds to the spectral sensitivity of silver halide. Examples of the light sources include a tungsten lamp, a halogen lamp, a xenon lamp, a xenon flash lamp, a mercury lamp, a carbon arc lamp, various laser means (e.g., semiconductor laser, helium neon laser, argon ion laser, helium cadmium laser), light emitting diode and cathode-ray tube. The wavelength is usually within the visible, near ultraviolet and near infrared regions. A X-ray and an electron bean are also available.

The amount of the exposure is usually in the range of 0.01 to 10,000 ergs/cm$^2$, and preferably in the range of 0.1 to 1,000 ergs/cm$^2$. The light-sensitive material may be exposed to light through a transparent support.

The exposure of silver halide, namely formation of latent image is influenced with the temperature and humidity at the exposing step. Accordingly, the sensitivity depends on the temperature and humidity. Therefore, the temperature and the humidity under the circumstances of the light source and the light-sensitive material are preferably controlled at constant values. An image recording apparatus having a controlling device is disclosed in Japanese Patent Provisional Publications No. 3(1991)-63143 and No. 3(1991)-63637.

In more detail, the temperature is preferably controlled within the range of a constant temperature ±5° C., which is preferably within the range of 5° to 40° C., and more preferably within the range of 10° to 35° C. The humidity in an apparatus containing the light-sensitive material and an optical system is also preferably controlled in the same manner. The humidity is preferably in the range of 10 to 80%RH (relative humidity), more preferably in the range of 15 to 75% RH, and most preferably in the range of 25 to 70%RH.

Developing Step

The light-sensitive material is developed simultaneously with or after the exposing step. The light-sensitive material is preferably heated to develop the silver halide. However, a wet development using a developing solution is also available.

The heat development can be conducted by placing the light-sensitive material on a heated material (e.g., metal plate, block, roller). The light-sensitive material may be immersed in a heated liquid for the development. Further, the light-sensitive material may be irradiated with an infrared ray. The surface of the light-sensitive material may be open to the air while heating the material from the side of the support. The surface of the light-sensitive material may be covered with the heating means to prevent the air from penetrating into the layers. In the case that the surface is open to the air, a layer of the light-sensitive material preferably contains a polymer having a function of prevent the air from penetrating into the layers.

The heating temperature is preferably in the range of 60° to 200° C., and more preferably in the range of 100° to 150° C. The heating time is preferably in the range of 1 to 180 seconds, and more preferably in the range of 5 to 60 seconds.

A preheat treatment or post-heat treatment can be conducted before or after the heat development. The temperature of the preheat is lower than the heat development temperature, and the time is shorter than the development time. The post-heat treatment can be conducted after the image is formed, for example after removing the unhardened hardening layer.

In the system wherein the unexposed area is hardened, a thermal polymerization initiator or a photopolymerization initiator is preferably contained in the light-sensitive material. Where a thermal polymerization initiator is used, the initiator can function at the heat development to form an initiator radical uniformly. Where the photopolymerization initiator is used, the light-sensitive material is uniformly exposed to light after the developing step. The light source is determined based on the sensitive wavelength of the photopolymerization initiator. Examples of the light sources are described at the exposing step. The exposure amount is usually in the range of $10^3$ to $10^7$ ergs/cm$^2$.

Removing step

The unhardened area can be selectively removed to form a polymer image based on a difference in the solubility between the hardened area and the unhardened area.

After the heat development, the light-sensitive material is immersed in a solvent (an etching solution) to conduct the removing step. An organic solvent, an aqueous alkaline solution and a mixture thereof are available as the solvent. The solvent should have a function of dissolving or swelling the unhardened area. Examples of the alkaline compound include sodium hydroxide, potassium hydroxide, sodium carbonate, sodium silicate, potassium silicate, sodium metasilicate, potassium metasilicate, sodium phosphate, potassium silicate, ammonia and aminoalcohols (e.g., monoethanolamine, diethanolamine, triethanolamine). An organic solvent is preferably added to an aqueous etching solution. The organic liquid preferably is an alcohol or an ether. Examples of the alcohols include lower alcohols (e.g., methanol, ethanol, propanol, butanol), alcohols having an aromatic group (e.g., benzyl alcohol, phenethyl alcohol), polyhydric alcohols (e.g., ethylene glycol, diethylene glycol, triethylene glycol, polyethylene glycol) and aminoalcohols described above as the alkaline compounds. Examples of the ethers are cellosolves. The solvent may further contain the other additives such as a surface active agent and a defoaming agent. Commercially available developing solutions are also available. Before the removing step, a light-sensitive layer or other hydrophilic layers may be removed by washing the light-sensitive material with water, or peeling the hydrophilic layers.

The removing step can also be conducted by a sheet based on a difference in the adhesion to the sheet between the hardened area and the unhardened area. The hardened area or the unhardened area is selectively attached to the removing sheet. An image can be formed on the area remaining on the light-sensitive material. The removing sheet can be laminated on the light-sensitive material before the exposing step or the developing step.

Transferring step

The obtained image can be transferred to an image receiving material based on a difference in the adhesion to the image receiving material between the hardened area and the unhardened area. The image receiving material can be laminated on the light-sensitive material before the exposing step or the developing step.

Toning step

A colored substance (toner) can be attached to the hardened area or the unhardened area. The toner can be selectively attached to the unhardened area based on a difference in the adhesion to the toner between the hardened area and the unhardened area. After the hardened area or the unhardened area is removed, the toner can be attached to the remaining area. Further, the toner can be attached to an adhesive layer, after the hardened area or the unhardened area on the adhesive layer is selectively removed. Furthermore, the toner can be attached to an image receiving material, after the hardened area or the unhardened area is selectively transferred to the image receiving material.

Dyeing step

The hardened area or the unhardened area can be selectively dyed to form a visible image. The dyeing step can also be conducted to an image receiving material, after the hardened area or the unhardened area is selectively transferred to the image receiving material.

The obtained image is available as a printing plate, a color proof, a hard copy or a relief image.

EXAMPLE 1

Preparation of aluminum support

A surface of an aluminum plate (according to JIS-A1050) having the thickness of 0.24 mm was ground using a nylon brush and an aqueous suspension of pumice stone of 400 mesh. The plate was well washed out with water. The aluminum plate was then immersed for etching in 10% aqueous solution of sodium hydroxide at 70° C. for 60 seconds. The plate was washed out with running water, then neutralized with 20% aqueous solution of nitric acid and washed out with water.

The obtained aluminum plate was subjected to an electrolytic surface-roughening treatment in 1% aqueous solution of nitric acid containing 0.5% aluminum nitrate in an anodically electric amount of 160 coulomb/dm$^2$ using sine wave alternating-corrugated current under such conditions as an anodic voltage of 12.7 V and a cathodically electric amount ratio to an anodically electric amount of 0.9. The center line average height (Ra) of the aluminum plate was The aluminum plate was immersed in 1% aqueous solution of sodium hydroxide at 40° C. for 30 seconds. The plate was then immersed in 30% sulfuric acid at 55° C. for 1 minute. Further, the plate was subjected to anodizing treatment in 20% aqueous solution of sulfuric acid at a current density of 2 A/dm$^2$ to form an anodic oxide layer having the thickness of 2.5 g/dm$^2$. The plate was washed with water and dried to obtain an aluminum support.

Formation of undercoating layer

On the aluminum support, 0.02 wt. % aqueous solution of silver nitrate was coated using a whirler (200 rpm). The layer was dried at 100° C. for 1 minute to form an undercoating layer.

Formation of hardening layer

The following coating solution was coated and dried on the undercoating layer to form a hardening layer having the dry thickness of about 1.3 μm.

| Coating solution of hardening layer | |
|---|---|
| Pentaerythritol tetraacrylate | 0.23 g |
| Allyl methacrylate-methacrylic acid copolymer (copolymerization ratio = 80/20) | 0.50 g |
| The following pigment dispersion | 4.47 g |
| 0.56 Wt. % methanol solution of the following additive | 0.56 g |
| 0.3 Wt. % aqueous solution of a surface active agent (Megafac F176PF, Dainippon Ink & Chemicals Inc.) | 1.00 g |
| Methyl ethyl ketone | 0.62 g |
| Propylene glycol monomethyl ether | 2.50 g |

(Additive)

Pigment dispersion

| Pigment (Chromofutal Red A2B, Ciba-Geigy) | 6.90 g |
|---|---|
| Allyl methacrylate-methacrylic acid copolymer (copolymerization ratio = 80/20) | 5.73 g |
| Cyclohexanone | 12.90 g |
| Propylene glycol monomethyl ether | 74.47 g |

Preparation of silver halide emulsion

Gelatin, potassium bromide and water were placed in a vessel and kept at 55° C. The following thioether compound ($2.0\times10^{-3}$ mol based on the amount of silver nitrate) was added to the vessel. Further, an aqueous solution of silver nitrate and an aqueous solution of potassium bromide containing a rhodium ammonium chloride (the molar ratio of rhodium to the total amount of potassium iodide and silver nitrate is $4\times10^{-8}$ mol) were added to the vessel according to a pAg controlled double jet method while keeping the pAg of 9.2 in the reaction vessel to prepare a silver iodobromide emulsion. Further, a potassium bromide solution containing hexachloroiridate(III) salt (the molar ratio of iridium to silver is $10^{-7}$ mol) was twice added to the emulsion at the same temperature and pAg 8.9 according to a double jet method to obtain a core/shell type silver iodobromide emulsion having the following composition.

(Thioether compound)

$$HO-CH_2-CH_2-S-CH_2-CH_2-S-CH_2-CH_2-OH$$

Core: Silver iodobromide (silver iodide content: 7.5 mol %)

Shell: Pure silver bromide

Core/shell: 3/7 (molar ratio of silver)

Average silver iodide content: 2.3 mol %

Average grain size: 0.28 μm

The grains of the obtained emulsion were monodispersed. In the emulsion, 98% of the grains have a grain size within the range of the average grain size ±40%.

After the emulsion was desalted, a methanol solution of the following sensitizing dye ($10^{-2}$M per liter) was added to the emulsion. The amount of the methanol solution was so adjusted that 200 ml of the solution was used based on 1 mol of silver nitrate. The emulsion was then adjusted to pH 6.2 and pAg 8.7. The emulsion was then subjected to a gold sulfur sensitization using sodium thiosulfate and chloroauric acid.

(Sensitizing dye)

Preparation of mercaptosilver compound

In 60 g of water, 2.8 g of polyvinyl alcohol (PVA-420, Kuraray Co., Ltd.) was dissolved. To the solution, 10.3 g of 0.1N potassium hydroxide solution was added. The mixture was heated to 50° C. To the solution, an aqueous solution containing 0.93 mmol of silver nitrate and a methanol solution containing 0.93 mmol of the following mercapto compound were simultaneously dropwise added for 20 minutes. After the addition, the mixture was stirred for 20 minutes. The mixture was cooled to the room temperature, and was adjusted to pH 6.3. Thus, a mercaptosilver compound (formed by converting —SH of the following compound to —SAg) was prepared. The yield was 113.68 g. The solution of the obtained compound had pAg of 6.31.

(Mercapto compound)

(Base precursor)

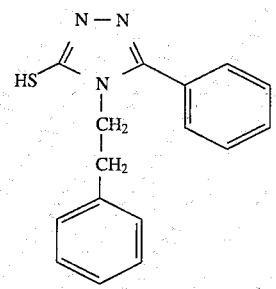

-continued

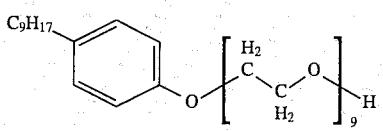

Formation of light-sensitive layer

The following coating solution was coated and dried on the hardening layer to form a light-sensitive layer having the dry thickness of about 1.2 μm.

| Coating solution of light-sensitive layer | |
|---|---|
| Polyvinyl alcohol (PVA-405, Kuraray Co., Ltd.) | 5.23 g |
| 5 Wt. % aqueous solution of the following surface active agent | 1.68 g |
| 10 Wt. % aqueous dispersion of the following reducing agent | 10.08 g |
| Phosphate buffer (KH$_2$PO$_4$: 0.025 mol per liter and Na$_2$HPO$_4$: 0.025 mol per liter) | 1.68 g |
| 0.5 Wt. % aqueous solution of potassium bromide | 2.10 g |
| 0.11 Wt. % aqueous solution of the above-prepared mercaptosilver compound | 3.20 g |
| The above-prepared silver halide emulsion (diluted 4.3 times with water) | 18.48 g |
| Water | 47.69 g |

(Surface active agent)

(Reducing agent)

Coating solution of light-sensitive layer

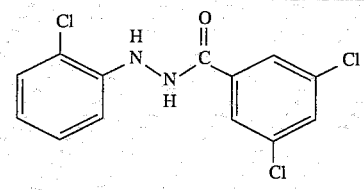

Preparation of base precursor dispersion In 750 g of 3 wt. % aqueous solution of poll;vinyl alcohol (PVA-205, Kuraray Co., Ltd.) was dispersed 250 g of powder of the following base precursor using Dynomill dispersing device.

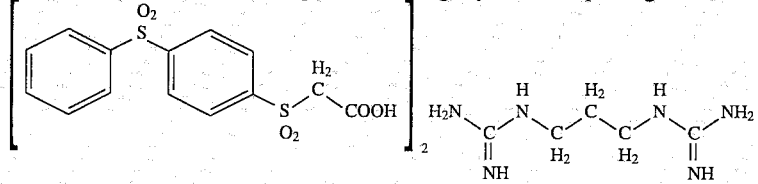

Formation of overcoating layer

The following coating solution was coated and dried on the light-sensitive layer to form an overcoating layer having the dry thickness of about 3.7 μm.

| Coating solution of overcoating layer | |
|---|---|
| Polyvinyl alcohol having the saponification degree of 98% (PVA-105, Kuraray Co., Ltd.) | 15.00 g |
| The base precursor dispersion | 5.63 g |
| Polyvinyl alcohol (I-1) | 0.30 g |
| Water | 135.0 g |

(Evaluation of the overcoating layer and the coating solution)

The coating solution for the overcoating layer was observed by a microscope. The agglomeration of the base precursor particles was evaluated. Further, the overcoating layer was also observed by a microscope, and the agglomeration was evaluated. The results are set forth in Table 3.

(Image formation)

The light-sensitive material was exposed to monochromatic light of 488 nm. The exposure was 3 μJ/cm$^2$. The support of the light-sensitive material was placed on a hot plate heated at 145° C. The light-sensitive material was washed with water to remove the light-sensitive layer and the overcoating layer. The hardening layer was etched with an aqueous alkaline solution, which was obtained by diluting Fuji Developing Solution DP-4 (Fuji Photo Film Co., Ltd.) eight times. The light-sensitive material was well washed with water to form a polymer relief image on the exposed area of the hardening layer. The resolving power was measured as the width of the recordable minute line in the polymer image. The results are set forth in Table 3.

Comparison Example 1

A light-sensitive material was prepared and evaluated in the same manner as in Example 1, except that the polyvinyl alcohol (I-1) was not added to the coating solution of the overcoating layer. The results are set forth in Table 3.

Comparison Example 2

A light-sensitive material was prepared and evaluated in the same manner as in Example 1, except that 0.3 wt. % of the ethylene oxide nonionic surface active agent (S-1) was added to the coating solution of the overcoating layer. The results are set forth in Table 3.

TABLE 3

| Light-sensitive material | Agglomeration of base precursor particles | | Resolving power |
|---|---|---|---|
| | Solution | Layer | |
| Example 1 | Not observed | Not observed | 10 μm |
| Comp. Exam. 1 | Observed | Observed | 25 μm |
| Comp. Exam. 2 | Observed | Observed | 25 μm |

It is apparent from the results shown in Table 3 that the stability of the base precursor dispersion is improved by adding the polyvinyl alcohol (I). Further, the layer is scarcely turbid. Therefore, the light-sensitive material of the present invention is improved in the resolving power.

EXAMPLE 2

The light-sensitive material prepared in Example 1 was imagewise exposed to light by scanning the material with an argon ion laser of 488 nm cooled in air. The exposure on the film surface was 3 μJ/cm². The aluminum support of the light-sensitive material was placed on a hot plate heated at 145° C. while opening the surface of the material in the air. As a result, silver halide was reduced and the hardening layer was hardened. A silver image was observed within the exposed area. The light-sensitive material was washed with water to remove the light-sensitive layer and the overcoating layer. The hardening layer was etched with a brush and the aqueous alkaline solution used in Example 1 in an automatic brushing developer to remove the hardening layer within the unexposed area. The light-sensitive material was well washed with water to form a hardened image. The obtained relief image was used as a printing plate in a printing machine. As a result, a clear print was obtained.

EXAMPLES 3 TO 11

Light-sensitive materials were prepared and evaluated in the same manner as in Example 1, except that the polyvinyl alcohol (I) was changed according to Table 4. Further, surface active agents were added to some light-sensitive materials as is shown in Table 4. The results are set forth in Table 5.

TABLE 4

| Light-sensitive material | Polyvinyl alcohol (I) | | Surface active agent | |
|---|---|---|---|---|
| | Kind | Amount | Kind | Amount |
| Example 3 | (I-2) | 0.30 g | | None |
| Example 4 | (I-3) | 0.30 g | | None |
| Example 5 | (I-4) | 0.30 g | | None |
| Example 6 | (I-1) | 0.30 g | (S-1) | 0.10 g |
| Example 7 | (I-1) | 0.30 g | (S-2) | 0.10 g |
| Example 8 | (I-1) | 0.30 g | (S-16) | 0.10 g |
| Example 9 | (I-1) | 0.30 g | (S-13) | 0.10 g |
| Example 10 | (I-1) | 0.30 g | (S-x) | 0.10 g |
| Example 11 | (I-1) | 0.30 g | (S-y) | 0.10 g |

(S-x) Anionic surface active agent

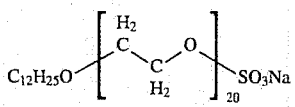

TABLE 4-continued

| Light-sensitive material | Polyvinyl alcohol (I) | | Surface active agent | |
|---|---|---|---|---|
| | Kind | Amount | Kind | Amount |

(S-y) Amphoteric surface active agent $$C_{12}H_{25}-\underset{\underset{CH_3}{|}}{\overset{\overset{CH_3}{|}}{N^+}}-CH_2-COO^-$$

TABLE 5

| Light-sensitive material | Agglomeration of base precursor particles | | Resolving power |
|---|---|---|---|
| | Solution | Layer | |
| Example 3 | Not observed | Not observed | 11 μm |
| Example 4 | Not observed | Not observed | 11 μm |
| Example 5 | Not observed | Not observed | 10 μm |
| Example 6 | Not observed | Not observed | 9 μm |
| Example 7 | Not observed | Not observed | 8 μm |
| Example 8 | Not observed | Not observed | 9 μm |
| Example 9 | Not observed | Not observed | 9 μm |
| Example 10 | Slightly observed | Slightly observed | 20 μm |
| Example 11 | Slightly observed | Slightly observed | 17 μm |

EXAMPLE 12

An undercoating layer and a hardening layer were coated on an aluminum support in the same manner as in Example 1.

Formation of light-sensitive layer

The following coating solution was coated and dried on the hardening layer to form a light-sensitive layer having the dry thickness of about 4.0 μm.

| Coating solution of light-sensitive layer | |
|---|---|
| The following acid modified polyvinyl alcohol | 5.23 g |
| 5 Wt. % aqueous solution of the polyvinyl alcohol (I-1) used in Example 1 | 0.25 g |
| 10 Wt. % aqueous dispersion of the reducing agent used in Example 1 | 10.08 g |
| 0.11 Wt. % aqueous solution of the mercaptosilver compound used in Example 1 | 3.20 g |
| The silver halide emulsion (diluted 4.3 times with water) used in Example 1 | 18.48 g |
| The base precursor dispersion used in Example 1 | 6.00 g |

(Acid modified polyvinyl alcohol)

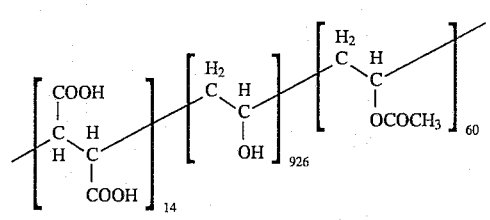

(Image formation)

The light-sensitive material was imagewise exposed to light by scanning the material with an air dried argon ion laser of 488 nm. The exposure on the film surface was 3

μJ/cm². The aluminum support of the light-sensitive material was placed on a hot plate heated at 145° C. while opening the surface of the material in the air. As a result, silver halide was reduced and the hardening layer was hardened. A silver image was observed within the exposed area. The light-sensitive material was washed with water to remove the light-sensitive layer. The light-sensitive layer was well dissolved in water. The hardening layer was etched with a brush and the aqueous alkaline solution used in Example 1 in an automatic brushing developer to remove the hardening layer within the unexposed area. The light-sensitive material was well washed with water to form a hardened image. The obtained relief image was used as a printing plate in a printing machine. As a result, a clear print was obtained.

EXAMPLE 13

A light-sensitive material was prepared in the same manner as in Example 1, except that the following coating solution of the overcoating layer was used.

| Coating solution of overcoating layer | |
|---|---|
| Polyvinyl alcohol having the saponification degree of 98% (PVA-105, Kuraray Co., Ltd.) | 15.00 g |
| The base precursor dispersion used in Example 1 | 5.63 g |
| Polyvinyl alcohol (II-1) | 0.30 g |
| Water | 135.0 g |

The light-sensitive material was evaluated in the same manner as in Example 1. The results are set forth in Table 6.

Comparison Example 3

A light-sensitive material was prepared and evaluated in the same manner as in Example 13, except that the polyvinyl alcohol (II-1) was not added to the coating solution of the overcoating layer. The results are set forth in Table 6.

Comparison Example 4

A light-sensitive material was prepared and evaluated in the same manner as in Example 13, except that 0.3 wt. % of the ethylene oxide nonionic surface active agent (S-1) was added to the coating solution of the overcoating layer. The results are set forth in Table 6.

TABLE 6

| Light-sensitive material | Agglomeration of base precursor particles | | Resolving power |
|---|---|---|---|
| | Solution | Layer | |
| Example 13 | Not observed | Not observed | 11 μm |
| Comp. Exam. 3 | Observed | Observed | 26 μm |
| Comp. Exam. 4 | Observed | Observed | 27 μm |

It is apparent from the results shown in Table 6 that the stability of the base precursor dispersion is improved by adding the polyvinyl alcohol (II). Further, the layer is scarcely turbid. Therefore, the light-sensitive material of the present invention is improved in the resolving power.

EXAMPLE 14

The light-sensitive material prepared in Example 13 was imagewise exposed to light by scanning the material with an argon ion laser of 488 nm cooled in air. The exposure on the film surface was 3 μJ/cm². The aluminum support of the light-sensitive material was placed on a hot plate heated at 145° C. while opening the surface of the material in the air. As a result, silver halide was reduced and the hardening layer was hardened. A silver image was observed within the exposed area. The light-sensitive material was washed with water to remove the light-sensitive layer and the overcoating layer. The hardening layer was etched with a brush and the aqueous alkaline solution used in Example 1 in an automatic brushing developer to remove the hardening layer within the unexposed area. The light-sensitive material was well washed with water to form a hardened image. The obtained relief image was used as a printing plate in a printing machine. As a result, a clear print was obtained.

EXAMPLES 15 TO 21

Light-sensitive materials were prepared and evaluated in the same manner as in Example 13, except that the polyvinyl alcohol (II) was changed according to Table 7. The amount of the polyvinyl alcohol (II) was 0.30 g. The results are set forth in Table 7.

TABLE 7

| Light-sensitive material | Polyvinyl alcohol (II) | Agglomeration of base precursor particles | | Resolving power |
|---|---|---|---|---|
| | | Solution | Layer | |
| Example 15 | (II-2) | None | None | 10 μm |
| Example 16 | (II-3) | None | None | 12 μm |
| Example 17 | (II-4) | None | None | 12 μm |
| Example 18 | (II-5) | None | None | 11 μm |
| Example 19 | (II-6) | None | None | 12 μm |
| Example 20 | (II-7) | None | None | 13 μm |
| Example 21 | (II-8) | None | None | 10 μm |

EXAMPLE 22

An undercoating layer and a hardening layer were coated on an aluminum support in the same manner as in Example 1.

Formation of light-sensitive layer

The following coating solution was coated and dried on the hardening layer to form a light-sensitive layer having the dry thickness of about 4.0 μm.

| Coating solution of light-sensitive layer | |
|---|---|
| The acid modified polyvinyl alcohol used in Example 12 | 5.23 g |
| Polyvinyl alcohol (II-1) | 0.25 g |
| 10 Wt. % aqueous dispersion of the reducing agent used in Example 1 | 10.08 g |
| 0.11 Wt. % aqueous solution of the mercaptosilver compound used in Example 1 | 3.20 g |
| The silver halide emulsion (diluted 4.3 times with water) used in Example 1 | 18.48 g |
| The base precursor dispersion used in Example 1 | 6.00 g |

(Image formation)

The light-sensitive material was imagewise exposed to light by scanning the material with an air dried argon ion laser of 488 nm. The exposure on the film surface was 3 μJ/cm². The aluminum support of the light-sensitive material was placed on a hot plate heated at 145° C. while opening the surface of the material in the air. As a result, silver halide was reduced and the hardening layer was hardened. A silver image was observed within the exposed area. The light-sensitive material was washed with water to remove the light-sensitive layer. The light-sensitive layer was well dissolved in water. The hardening layer was etched with a brush and the aqueous alkaline solution used in Example 1 in an automatic brushing developer to remove the hardening layer within the unexposed area. The light-sensitive material was well washed with water to form a hardened image. The obtained relief image was used as a printing plate in a printing machine. As a result, a clear print was obtained.

EXAMPLE 23

A light-sensitive material was prepared in the same manner as in Example 1, except that the following coating solution of the overcoating layer was used.

| Coating solution of overcoating layer | |
|---|---|
| Polyvinyl alcohol (III) (saponification degree: 98%, PVA-105, Kuraray Co., Ltd.) | 15.00 g |
| The base precursor dispersion used in Example 1 | 5.63 g |
| Polyvinyl alcohol (IV-1) (saponification degree: 88%, block character (η): 0.50) | 0.30 g |
| Water | 135.0 g |

The light-sensitive material was evaluated in the same manner as in Example 1. The results are set forth in Table 8.

Comparison Example 5

A light-sensitive material was prepared and evaluated in the same manner as in Example 22, except that the polyvinyl alcohol (IV-1) was not added to the coating solution of the overcoating layer. The results are set forth in Table 8.

Comparison Example 6

A light-sensitive material was prepared and evaluated in the same manner as in Example 22, except that another polyvinyl alcohol (block character: 0.64, saponification degree: 88%, polymerization degree: 1,000) was used in place of the polyvinyl alcohol (IV-1). The used polyvinyl alcohol obtained by a saponification reaction in methanol. The results are set forth in Table 8.

Comparison Example 7

A light-sensitive material was prepared and evaluated in the same manner as in Example 22, except that another polyvinyl alcohol (block character: 0.84, saponification degree: 88%, polymerization degree: 1,000) was used in place of the polyvinyl alcohol (IV-1). The used polyvinyl alcohol obtained by adding acetic group to a completely saponified polyvinyl alcohol. The results are set forth in Table 8.

TABLE 8

| Light-sensitive material | Agglomeration of base precursor particles | | Resolving power |
|---|---|---|---|
| | Solution | Layer | |
| Example 23 | Not observed | Not observed | 11 μm |
| Comp. Exam. 5 | Observed | Observed | 26 μm |
| Comp. Exam. 6 | Observed | Observed | 25 μm |
| Comp. Exam. 7 | Observed | Observed | 27 μm |

It is apparent from the results shown in Table 8 that the stability of the base precursor dispersion is improved by adding the mixture of the polyvinyl alcohols (III) & (IV).

Further, the layer is scarcely turbid. Therefore, the light-sensitive material of the present invention is improved in the resolving power.

EXAMPLE 24

The light-sensitive material prepared in Example 23 was imagewise exposed to light by scanning the material with an argon ion laser of 488 nm cooled in air. The exposure on the film surface was 3 μJ/cm². The aluminum support of the light-sensitive material was placed on a hot plate heated at 145° C. while opening the surface of the material in the air. As a result, silver halide was reduced and the hardening layer was hardened. A silver image was observed within the exposed area. The light-sensitive material was washed with water to remove the light-sensitive layer and the overcoating layer. The hardening layer was etched with a brush and the aqueous alkaline solution used in Example 1 in an automatic brushing developer to remove the hardening layer within the unexposed area. The light-sensitive material was well washed with water to form a hardened image. The obtained relief image was used as a printing plate in a printing machine. As a result, a clear print was obtained.

EXAMPLES 25 TO 31

Light-sensitive materials were prepared and evaluated in the same manner as in Example 23, except that the polyvinyl alcohol (IV) was changed according to Table 9. The amount of the polyvinyl alcohol (IV) was 0.30 g. The results are set forth in Table 9.

TABLE 9

| Light-sensitive material | Polyvinyl alcohol (IV) | Agglomeration of base precursor particles | | Resolving power |
|---|---|---|---|---|
| | | Solution | Layer | |
| Example 25 | (IV-2) | None | None | 10 μm |
| Example 26 | (IV-3) | None | None | 12 μm |
| Example 27 | (IV-4) | None | None | 10 μm |
| Example 28 | (IV-5) | None | None | 11 μm |
| Example 29 | (IV-6) | None | None | 12 μm |
| Example 30 | (IV-7) | None | None | 10 μm |
| Example 31 | (IV-8) | None | None | 10 μm |

EXAMPLE 32

An undercoating layer and a hardening layer were coated on an aluminum support in the same manner as in Example 1.

Formation of light-sensitive layer

The following coating solution was coated and dried on the hardening layer to form a light-sensitive layer having the dry thickness of about 4.0 μm.

| Coating solution of light-sensitive layer | |
|---|---|
| The acid modified polyvinyl alcohol used in Example 12 | 5.23 g |
| Polyvinyl alcohol (IV-1) | 0.25 g |
| 10 Wt. % aqueous dispersion of the reducing agent used in Example 1 | 10.08 g |
| 0.11 Wt. % aqueous solution of the mercaptosilver compound used in Example 1 | 3.20 g |
| The silver halide emulsion (diluted 4.3 times with water) used in Example 1 | 18.48 g |
| The base precursor dispersion used in Example 1 | 6.00 g |

(Image formation)

The light-sensitive material was imagewise exposed to light by scanning the material with an air dried argon ion laser of 488 nm. The exposure on the film surface was 3 μJ/cm². The aluminum support of the light-sensitive material was placed on a hot plate heated at 145° C. while opening the surface of the material in the air. As a result, silver halide was reduced and the hardening layer was hardened. A silver image was observed within the exposed area. The light-sensitive material was washed with water to remove the light-sensitive layer. The light-sensitive layer was well dissolved in water. The hardening layer was etched with a brush and the aqueous alkaline solution used in Example 1 in an automatic brushing developer to remove the hardening layer within the unexposed area. The light-sensitive material was well washed with water to form a hardened image. The obtained relief image was used as a printing plate in a printing machine. As a result, a clear print was obtained.

Comparison Example 8

A light-sensitive material was prepared in the same manner as in Example 22, except that the polyvinyl alcohol (III) was not used and the amount of the polyvinyl alcohol (IV-1) was changed from 0.30 g to 15.30 g. The obtained light-sensitive material was treated in the same manner as in Example 23 to form a relief image. However, the hardness of the obtained image was insufficient to use the image as a printing plate.

We claim:

1. A silver halide light-sensitive material which comprises a support and two or more layers, and silver halide, a reducing agent, an ethylenically unsaturated polymerizable compound or a cross-linkable polymer and a base precursor being independently contained in at least one of the layers, wherein a layer containing the base precursor further contains a modified polyvinyl alcohol (I) having such a chemical structure that a terminal alkyl group having 4 or more carbon atoms is attached to a polyvinyl alcohol.

2. The silver halide light-sensitive material as claimed in claim 1, wherein the polyvinyl alcohol (I) is represented by the formula (Ia):

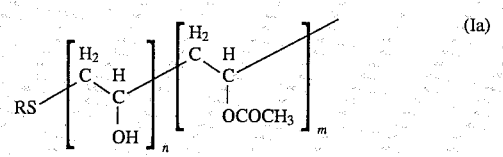

wherein R is an alkyl group having 4 or more carbon atoms, n is not less than 60, m is not more than 40, and n+m is 100.

3. The silver halide light-sensitive material as claimed in claim 1, wherein the polyvinyl alcohol (I) has a saponification degree of not less than 60%.

4. The silver halide light-sensitive material as claimed in claim 1, wherein the amount of the polyvinyl alcohol (I) is in the range of 0.1 to 20% based on the solid content of the layer containing the base precursor.

5. The silver halide light-sensitive material as claimed in claim 1, wherein the layer containing the base precursor furthermore contains an ethylene oxide nonionic surface active agent.

6. The silver halide light-sensitive material as claimed in claim 5, wherein the amount of the ethylene oxide nonionic surface active agent is in the range of 0.001 to 5 wt. % based on the coating amount of the layer containing the base precursor.

7. A silver halide light-sensitive material which comprises a support and two or more layers, and silver halide, a reducing agent, an ethylenically unsaturated polymerizable compound or a cross-linkable polymer and a base precursor being independently contained in at least one of the layers, wherein a layer containing the base precursor further contains a mixture of polyvinyl alcohols (II) and (V), said polyvinyl alcohol (II) being a block copolymer consisting of vinyl alcohol units and hydrophobic units which are more hydrophobic than the vinyl alcohol units, and said polyvinyl alcohol (V) having a saponification degree of not less than 90%.

8. The silver halide light-sensitive material as claimed in claim 7, wherein the hydrophobic units are derived from ethylenically unsaturated monomers.

9. The silver halide light-sensitive material as claimed in claim 7, wherein the polyvinyl alcohol (II) contains the hydrophobic units in an amount of 1 to 50 mol %.

10. The silver halide light-sensitive material as claimed in claim 7, wherein the vinyl alcohol units of the polyvinyl alcohol (II) have a saponification degree of not less than 60%.

11. The silver halide light-sensitive material as claimed in claim 7, wherein the amount of the polyvinyl alcohol (II) is in the range of 0.1 to 20% based on the solid content of the layer containing the base precursor.

12. A silver halide light-sensitive material which comprises a support and two or more layers, and silver halide, a reducing agent, an ethylenically unsaturated polymerizable compound or a base precursor being independently contained in at least one of the layers, wherein a layer containing the base precursor further contains a mixture of polyvinyl alcohols (III) and (IV), said polyvinyl alcohol (III) having a saponification degree of not less than 95%, and said polyvinyl alcohol (IV) having a saponification degree of less than 95% and a block character of not more than 0.5.

13. The silver halide light-sensitive material as claimed in claim 12, wherein the amount of the polyvinyl alcohol (IV) is not more than 20 wt. % based on the amount of the polyvinyl alcohol (III).

14. The silver halide light-sensitive material as claimed in claim 12, wherein the amount of the polyvinyl alcohol (III) is in the range of 40 to 95% based on the solid content of the layer containing the base precursor.

15. The silver halide light-sensitive material as claimed in claim 12, wherein the amount of the polyvinyl alcohol (IV) is in the range of 0.1 to 20% based on the solid content of the layer containing the base precursor.

16. The silver halide light-sensitive material as claimed in claim 1, wherein said silver halide light-sensitive material comprises a support, a hardening layer, a light-sensitive layer and an overcoat layer, wherein said hardening layer contains an ethylenically unsaturated polymerizable compound and a cross-linkable polymer, the light-sensitive layer contains silver halide and a reducing agent, and the overcoat layer contains a base precursor and said polyvinyl alcohol (I).

17. The silver halide light-sensitive material as claimed in claim 1, wherein the silver halide light-sensitive material comprises a support, a hardening layer and a light-sensitive layer, wherein the hardening layer contains an ethylenically unsaturated polymerizable compound and a cross-linkable polymer, the light-sensitive layer contains silver halide, a reducing agent, a base precursor and said polyvinyl alcohol (I).

18. The silver halide light-sensitive material as claimed in claim 7, wherein said silver halide light-sensitive material comprises a support, a hardening layer, a light-sensitive layer and an overcoat layer, wherein said hardening layer contains an ethylenically unsaturated polymerizable compound and a cross-linkable polymer, the light-sensitive layer contains silver halide and a reducing agent, and the overcoat layer contains a base precursor and said mixture of polyvinyl alcohols (II) and (V).

19. The silver halide light-sensitive material as claimed in claim 7, wherein the silver halide light-sensitive material comprises a support, a hardening layer and a light-sensitive layer, wherein the hardening layer contains an ethylenically unsaturated polymerizable compound and a cross-linkable polymer, the light-sensitive layer contains silver halide, a reducing agent, a base precursor and said mixture of polyvinyl alcohols (II) and (V).

20. The silver halide light-sensitive material as claimed in claim 12, wherein said silver halide light-sensitive material comprises a support, a hardening layer, a light-sensitive layer and an overcoat layer, wherein said hardening layer contains an ethylenically unsaturated polymerizable compound and a cross-linkable polymer, the light-sensitive layer contains silver halide and a reducing agent, and the overcoat layer contains a base precursor and said mixture of a polyvinyl alcohols (III) and (IV).

21. The silver halide light-sensitive material as claimed in claim 12, wherein the silver halide light-sensitive material comprises a support, a hardening layer and a light-sensitive layer, wherein the hardening layer contains an ethylenically unsaturated polymerizable compound and a cross-linkable polymer, the light-sensitive layer contains silver halide, a reducing agent, a base precursor and said mixture of polyvinyl alcohols (III) and (IV).

* * * * *